(12) United States Patent
Shimoda et al.

(10) Patent No.: US 8,817,166 B2
(45) Date of Patent: Aug. 26, 2014

(54) IMAGING DEVICE AND IMAGING APPARATUS

(75) Inventors: Kazuhito Shimoda, Kyoto (JP);
Shinichi Fujii, Kanagawa (JP)

(73) Assignee: Sony Corporation, Tokyo (JP)

( * ) Notice: Subject to any disclaimer, the term of this patent is extended or adjusted under 35 U.S.C. 154(b) by 456 days.

(21) Appl. No.: 13/165,960

(22) Filed: Jun. 22, 2011

(65) Prior Publication Data
US 2012/0044406 A1 Feb. 23, 2012

(30) Foreign Application Priority Data

Aug. 18, 2010 (JP) ................................. 2010-183149

(51) Int. Cl.
*H04N 5/235* (2006.01)
*H04N 5/225* (2006.01)

(52) U.S. Cl.
USPC ...................................... 348/345; 348/207.99

(58) Field of Classification Search
USPC .......... 348/345, 362–363, 372–376; 359/350; 396/71–72; 257/291–292
See application file for complete search history.

(56) References Cited

U.S. PATENT DOCUMENTS

| 2005/0275904 A1* | 12/2005 | Kido et al. | 358/461 |
| 2009/0079019 A1* | 3/2009 | Funao | 257/432 |
| 2010/0059844 A1* | 3/2010 | Tanaka | 257/432 |
| 2010/0188532 A1* | 7/2010 | Kusaka et al. | 348/240.99 |

FOREIGN PATENT DOCUMENTS

JP 2009-109965 5/2009

* cited by examiner

*Primary Examiner* — Trung Diep
(74) *Attorney, Agent, or Firm* — Sony Corporation

(57) ABSTRACT

An imaging device includes: a microlens that focuses subject light; a light receiving element that receives the subject light focused by the microlens to thereby generate a signal for making focus determination through phase-difference detection; and a light blocking portion that is disposed between the microlens and the light receiving element so as to block part of the subject light focused by the microlens, wherein the distance between the light blocking portion and the microlens in an optical axis direction of the microlens is set so as to decrease as an image height increases.

14 Claims, 17 Drawing Sheets

IMAGING DEVICE AND IMAGING APPARATUS

FIELD

The present disclosure relates to an imaging device, and more particularly, to an imaging device and an imaging apparatus that perform phase-difference detection.

BACKGROUND

In recent years, an imaging apparatus such as a digital still camera that images a subject such as a person to generate captured images and records the generated captured images has been popularized. Moreover, an imaging apparatus having an autofocus (AF) function of automatically performing focus adjustment during imaging in order to make a user's shooting operation easy has been widely used as the imaging apparatus.

As an example of such an imaging apparatus, an imaging apparatus in which light having passed through an imaging lens is pupil-split to form a pair of images, and the position of the imaging lens is determined by measuring the distance between the two formed images (detecting a phase difference) has been proposed. For example, an imaging apparatus in which pixels (phase-difference detection pixels) for phase-difference detection (focus detection) for performing pupil splitting by blocking the half of subject light received by a light receiving element and pixels (image generation pixels) for generating captured images are provided in an imaging device has been proposed. When performing phase-difference detection, the imaging apparatus forms a pair of images from the signals of the phase-difference detection pixels and measures the distance between the two formed images to thereby calculate the amount of focus shift. Subsequently, the imaging apparatus calculates a displacement of the imaging lens based on the calculated amount of focus shift and adjusts the position of the imaging lens based on the calculated displacement to thereby achieve focusing (focus adjustment).

In order to perform phase-difference detection and image generation with high precision, an imaging apparatus in which the focusing position in the phase-difference detection pixel is different from the focusing position in the image generation pixel has been proposed (for example, see FIG. 8 of JP-A-2009-109965). In the imaging apparatus, a microlens provided in the phase-difference detection pixel has different characteristics from the characteristics of a microlens provided in the image generation pixel by changing a lens thickness, a lens diameter, or a lens material. Alternatively, in the imaging apparatus, the distance between the microlens and the light receiving element in the phase-difference detection pixel is different from the distance between the microlens and the light receiving element in the image generation pixel.

SUMMARY

In the related art described above, the focusing position in the image generation pixel is set on the light receiving element side, and the focusing position in the phase-difference detection pixel is set to be closer to the microlens side than the focusing position in the image generation pixel.

However, in the above related art, in order to provide different lenses in the phase-difference detection pixel and the image generation pixel and make the structure of the phase-difference detection pixel different from the structure of the image generation pixel, the manufacturing process incurs complex steps.

Moreover, in the related art technique, the unevenness of characteristics (phase-difference characteristics) of the phase-difference detection pixel resulting from the fact that the phase-difference detection pixels are disposed at different positions in the imaging device is not taken into consideration. For example, the precision of pupil-splitting of the subject light is not the same in the central position and the ends of the image generation pixel. Thus, it is important to reduce the unevenness in the phase-difference characteristics and to homogenize the phase-difference characteristics.

It is therefore desirable to homogenize the phase-difference characteristics in the imaging device.

An embodiment of the present disclosure is directed to an imaging device including: a microlens that focuses subject light; a light receiving element that receives the subject light focused by the microlens to thereby generate a signal for making focus determination through phase-difference detection; and a light blocking portion that is disposed between the microlens and the light receiving element so as to block part of the subject light focused by the microlens, wherein the distance between the light blocking portion and the microlens in an optical axis direction of the microlens is set so as to decrease as an image height increases. With this configuration, in phase-difference detection pixels of the imaging device, the distance between the light blocking portion and the microlens is set so as to decrease as the image height increases.

In this embodiment of the present disclosure, the distance between the microlens and the light receiving element may be approximately the same in each pixel, and the light blocking portion may be disposed so that the distance between the light blocking portion and the light receiving element in the optical axis direction increases as the image height increases. With this configuration, in the imaging device in which the distance between the microlens and the light receiving element is approximately the same in each pixel, the light blocking portion is disposed so that the distance between the light blocking portion and the light receiving element increases as the image height increases.

In this embodiment of the present disclosure, the distance between the microlens and the light receiving element may decrease as the image height increases, and the light blocking portion may be disposed so that the distance between the light blocking portion and the light receiving element in the optical axis direction is approximately the same in each pixel. With this configuration, in the imaging device in which the distance between the microlens and the light receiving element decreases as the image height increases, the light blocking portion is disposed so that the distance between the light blocking portion and the light receiving element is approximately the same in each pixel. Moreover, in this case, the microlens may be disposed in each pixel on the same plane that is orthogonal to the optical axis direction. With this configuration, in the imaging device in which the microlens is disposed in each pixel on the same plane that is orthogonal to the optical axis direction, the light blocking portion is disposed so that the distance between the light blocking portion and the microlens decreases as the image height increases. Moreover, in this case, the light receiving element may be disposed in each pixel on the same plane that is orthogonal to the optical axis direction. With this configuration, in the imaging device in which the light receiving element is disposed in each pixel on the same plane that is orthogonal to the optical axis direction, the light blocking portion is disposed so that the distance between the light blocking portion and the microlens decreases as the image height increases.

In this embodiment of the present disclosure, the light blocking portion may be disposed so that an image point of the focused subject light is approximately identical to the position of the light blocking portion in the optical axis direction. With this configuration, in the phase-difference detection pixels of the imaging device, the light blocking portion is disposed so that the image point of the focused subject light is approximately identical to the position of the light blocking portion in the optical axis direction. Moreover, in this case, the microlens may be disposed so that an image point of a principal ray of the focused subject light is approximately identical to an end of the light blocking portion close to the center of the light receiving element in a direction orthogonal to the optical axis direction. With this configuration, in the phase-difference detection pixels of the imaging device, the microlens is disposed so that the image point of the principal ray of the focused subject light is approximately identical to the end of the light blocking portion close to the center of the light receiving element.

In this embodiment of the present disclosure, the phase-difference detection pixels used for performing the phase-difference detection and the image generation pixels used for generating image signals may coexist in the imaging device, the phase-difference detection pixels may be formed by the microlens, the light receiving element, and the light blocking portion, and the image generation pixels may include a light receiving element and a microlens having the same characteristics as the light receiving element and the microlens. With this configuration, in the imaging device in which the phase-difference detection pixels and the image generation pixels coexist, the light blocking portion is disposed so that the distance between the light blocking portion and the microlens decreases as the image height increases. Moreover, in this case, the line of phase-difference detection pixels and the line of image generation pixels may alternate each other in the imaging device in a direction orthogonal to a readout direction in which data generated by the phase-difference detection pixels and the image generation pixels are read out from the phase-difference detection pixels and the image generation pixels. With this configuration, in the imaging device in which the line of phase-difference detection pixels and the line of image generation pixels alternate each other, the light blocking portion is disposed so that the distance between the light blocking portion and the microlens decreases as the image height increases.

Another embodiment of the present disclosure is directed to an imaging apparatus including: an imaging device including a microlens that focuses subject light, a light receiving element that receives the subject light focused by the microlens to thereby generate a signal for making focus determination through phase-difference detection, and a light blocking portion that is disposed between the microlens and the light receiving element so as to block part of the subject light focused by the microlens, in which the distance between the light blocking portion and the microlens in an optical axis direction of the microlens is set so as to decrease as an image height increases; and a focus determination section that performs the focus detection based on a signal generated by the imaging device. With this configuration, focus determination is performed based on the signal generated by the phase-difference detection pixels in which the light blocking portion is disposed so that the distance between the light blocking portion and the microlens decreases as the image height increases.

According to the embodiments of the present disclosure, it is possible to obtain an excellent effect in that the phase-difference characteristics in the imaging device can be homogenized.

DETAILED DESCRIPTION

Hereinafter, modes for implementing the present disclosure (hereinafter referred to as embodiments) will be described. The description will be given in the following order.

1. First Embodiment (imaging control: example in which distance adjustment layer is provided between light receiving element and light blocking layer)

2. Second Embodiment (imaging control: example in which distance adjustment layer is formed before forming light receiving element)

3. Third Embodiment (imaging control: example in which distance adjustment layer is formed so that height of microlens from light receiving element decreases with image height)

<1. First Embodiment>
[Functional Configuration Example of Imaging Apparatus]

Figure 1:
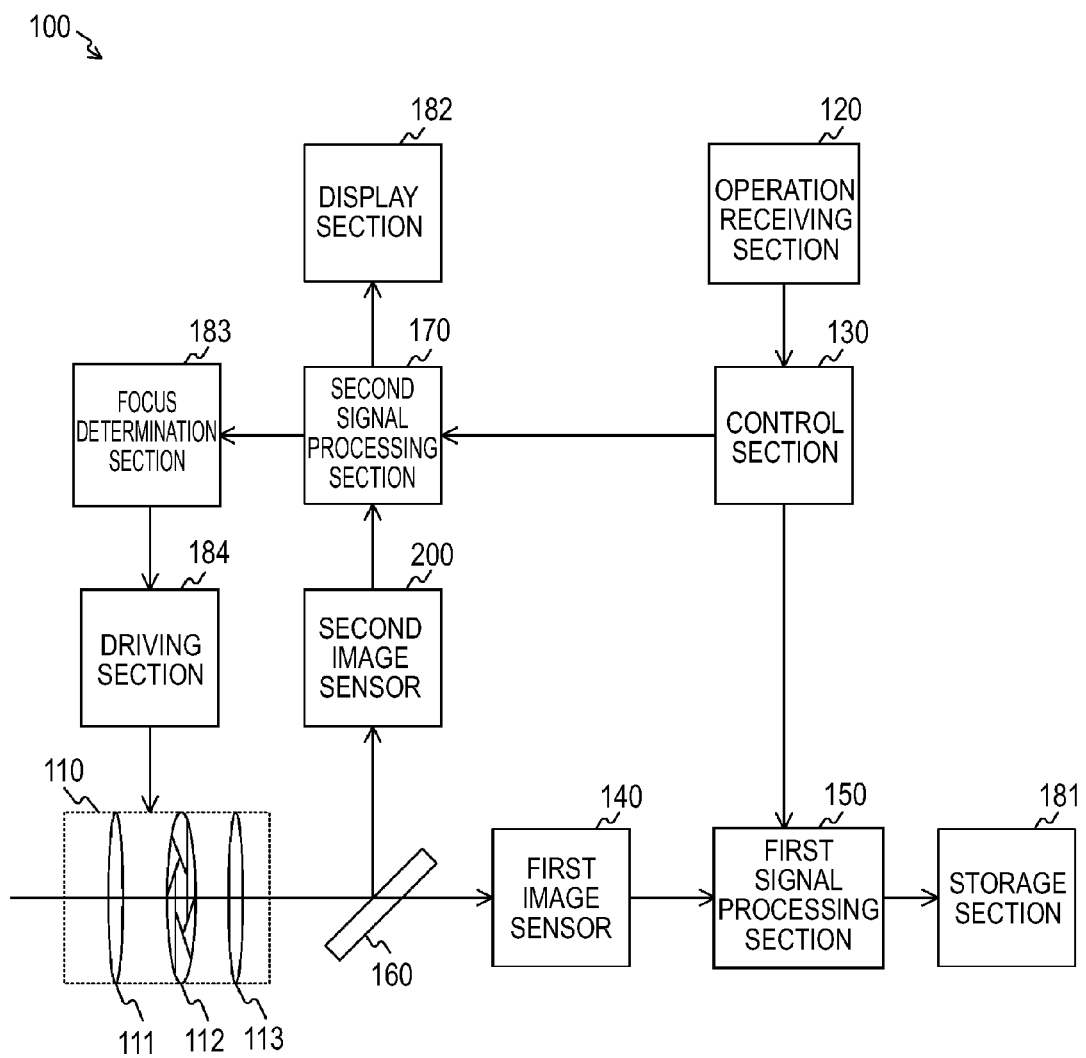
FIG. 1 is a block diagram showing an example of a functional configuration of an imaging apparatus according to a first embodiment of the present disclosure.

FIG. 1 is a block diagram showing an example of a functional configuration of an imaging apparatus 100 according to the first embodiment of the present disclosure. The imaging apparatus 100 is an imaging apparatus that images a subject to generate image data (captured images) and records the generated image data as image content (still image content or moving image content). In the following description, an example in which still image content (still image files) is recorded as image content (image files) will be mainly described.

The imaging apparatus 100 includes a lens section 110, an operation receiving section 120, a control section 130, a first image sensor 140, and a first signal processing section 150. Moreover, the imaging apparatus 100 includes a pellicle mirror 160, a second image sensor 200, a second signal processing section 170, a storage section 181, a display section 182, a focus determination section 183, and a driving section 184.

The lens section 110 is configured to focus light (subject light) from a subject. The lens section 110 includes a zoom lens 111, a diaphragm 112, and a focusing lens 113.

The zoom lens 111 is configured to move in an optical axis direction with the driving of the driving section 184 to change a focal distance, thereby adjusting magnification of the subject included in a captured image.

The diaphragm 112 is a masking member configured to change the degree of opening with the driving of the driving section 184 to thereby adjust the intensity of the subject light entering the first and second image sensors 140 and 200.

The focusing lens 113 is configured to move in the optical axis direction with the driving of the driving section 184 to thereby adjust focus.

The operation receiving section 120 is configured to receive an operation from the user. When a shutter button 121 (shown in FIG. 2) is pressed, for example, the operation receiving section 120 supplies a signal associated with the pressing to the control section 130 as an operation signal.

The control section 130 is configured to control the operation of each part of the imaging apparatus 100. For example, when the shutter button 121 is pressed and an operation signal for starting recording of still images is received, the control section 130 supplies a signal (still-image capturing operation signal) associated with execution of recording of still images to the first signal processing section 150. Moreover, when a live view is displayed on the display section 182, the control section 130 supplies a signal (live-view display signal) for generating a live-view image based on a signal output by the second image sensor 200 to the second signal processing section 170. Here, the live view is a realtime display of a subject image entering the imaging apparatus 100. Moreover, when focus determination is performed by a phase-difference detection method, the control section 130 supplies a signal (phase-difference detection operation signal) indicating an operation (phase-difference detection operation) of performing the focus determination to the second signal processing section 170. Here, the phase-difference detection method is a focus detection method of pupil-splitting light having passed through an imaging lens to form a pair of images and measuring the distance (the amount of shift) between the two formed images (detecting a phase difference) to thereby detect the degree of focus.

The pellicle mirror 160 is configured to split the subject light focused by the lens section 110 into two light components. The pellicle mirror 160 is a semi-transmissive mirror, for example, and divides the subject light into two light components by reflecting 30% of the subject light. The pellicle mirror 160 supplies one of the two split light components to the first image sensor 140 and supplies the other light component to the second image sensor 200.

The first image sensor 140 is an imaging device that receives one of the subject light components split by the pellicle mirror 160 and photoelectrically converts the received subject light into an electrical signal. The first image sensor 140 is realized, for example, by a CMOS (Complementary Metal Oxide Semiconductor) sensor, a CCD (Charge Coupled Device) sensor, and the like. In the first image sensor 140, only pixels (image generation pixels) used for generating signals for generating captured images based on the received subject light are arranged in the Beyer arrangement. The first image sensor 140 supplies the electrical signal generated by photoelectric conversion to the first signal processing section 150.

The first signal processing section 150 is configured to perform various signal processes to the electrical signal supplied from the first image sensor 140. When the still-image capturing operation signal is supplied from the control section 130, for example, the first signal processing section 150 generates data of still images (still-image data). Moreover, the first signal processing section 150 supplies the generated image data to the storage section 181 and stores the same in the storage section 181.

The storage section 181 is configured to record the image data supplied from the first signal processing section 150 as image content (image files). For example, a removable recording medium (one or plural recording media) such as a disc (for example, a DVD (Digital Versatile Disc)) or a semiconductor memory (for example, a memory card) can be used as the storage section 181. Moreover, these recording media may be installed in the imaging apparatus 100 and may be removably attached to the imaging apparatus 100.

The second image sensor 200 is an imaging device that receives one of the other subject light components split by the pellicle mirror 160 and photoelectrically converts the received subject light into an electrical signal. The second image sensor 200 is realized, for example, by a CMOS sensor similarly to the first image sensor 140. In the second image sensor 200, image generation pixels and pixels (phase-difference detection pixels) used for generating signals for performing phase-difference detection are arranged. The second image sensor 200 will be described with reference to FIGS. 3 to 13. The second image sensor 200 supplies the electrical signal generated by photoelectric conversion to the second signal processing section 170. The second image sensor 200 is an example of an imaging device as described in the appended claims.

The second signal processing section 170 is configured to perform various signal processes to the electrical signal supplied from the second image sensor 200. When the phase-difference detection operation signal is supplied from the control section 130, for example, the second signal processing section 170 generates data (phase-difference detection data) for detecting a phase difference based on the output signals from the phase-difference detection pixels in the second image sensor 200. Moreover, the second signal processing section 170 supplies the generated phase-difference detection data to the focus determination section 183. Moreover, when a live-view display signal is supplied from the control section 130, the second signal processing section 170 generates data of live-view images (live-view image data) based on the output signals from the image generation pixels in the second image sensor 200. Then, the second signal processing section 170 supplies the generated live-view image data to the display section 182 so as to be displayed on a display screen of the display section 182.

The display section 182 is configured to display images based on the image data supplied from the second signal processing section 170. The display section 182 is realized by a color liquid-crystal panel, for example. When live-view image data are supplied from the second signal processing section 170, for example, the display section 182 displays a live-view image on the display screen.

The focus determination section 183 is configured to determine whether a target object to be focused (focusing target object) is in focus based on the phase-difference detection data supplied from the second signal processing section 170. When an object (focusing target object) in a focusing area is in focus, the focus determination section 183 supplies information indicating the in-focus state to the driving section 184 as focus determination result information. Moreover, when the focusing target object is out of focus, the focus determination section 183 calculates the amount of focus shift (defocus amount) and supplies information indicating the calculated defocus amount to the driving section 184 as the focus determination result information.

The driving section 184 is configured to drive the zoom lens 111, the diaphragm 112, and the focusing lens 113. For example, the driving section 184 calculates the amount of driving of the focusing lens 113 based on the focus determination result information output from the focus determination section 183 and moves the focusing lens 113 in accordance with the calculated driving amount. When the focusing target object is in focus, the driving section 184 maintains the present position of the focusing lens 113. When the focusing target object is out of focus, the driving section 184 calculates the driving amount (movement distance) based on the focus determination result information indicating the defocus amount and the position information of the focusing lens 113 and moves the focusing lens 113 in accordance with the driving amount.

[Example of Position of Pellicle Mirror]

Figure 2:
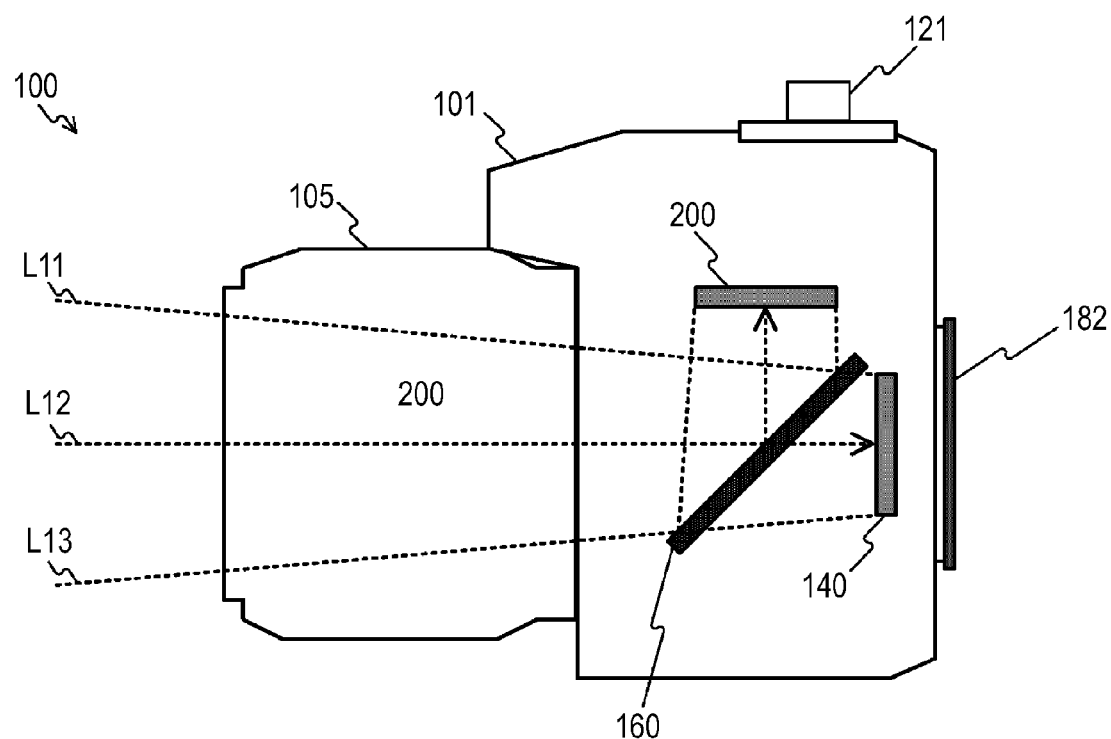
FIG. 2 is a cross-sectional view schematically showing an example of the position of a pellicle mirror in the imaging apparatus according to the first embodiment of the present disclosure.

FIG. 2 is a cross-sectional view schematically showing an example of the position of the pellicle mirror 160 in the imaging apparatus 100 according to the first embodiment of the present disclosure. In FIG. 2, it is assumed that the imaging apparatus 100 is a single-lens reflex camera.

In FIG. 2, a body 101 and a replacement lens 105 are shown as the cross-sectional view of the imaging apparatus 100. The replacement lens 105 is a removable lens unit of the imaging apparatus 100 and corresponds to the lens section 110 shown in FIG. 1. The body 101 is a main body of the imaging apparatus 100 that performs an imaging process and corresponds to the configuration other than the lens section 110 shown in FIG. 1. In the body 101, the shutter button 121, the display section 182, the pellicle mirror 160, the first and second image sensors 140 and 200, and the replacement lens 105 are shown.

Moreover, in FIG. 2, the optical axis (optical axis L12) of the lens provided in the lens section 110 and two lines (lines L11 and L13) representing the range in which the subject light passes are shown. In addition, the range between the two lines L11 and L13 represents the range in which the light entering the first and second image sensors 140 and 200 passes.

The pellicle mirror 160 is disposed so as to split the subject light entering the imaging apparatus 100 into two light components. For example, the pellicle mirror 160 is disposed to be at 45° with respect to the optical axis L12. Therefore, the pellicle mirror 160 reflects part (for example, 30%) of the subject light to the upper side.

The first image sensor 140 is disposed at the end (destination of the subject light) of the pellicle mirror 160 to be vertical to the optical axis L12 so as to receive the subject light having passed through the pellicle mirror 160.

The second image sensor 200 is disposed above the pellicle mirror 160 to be parallel to the optical axis L12 (since the pellicle mirror 160 is at 45° with respect to the optical axis L12) so as to receive the subject light reflected by the pellicle mirror 160.

As described above, the pellicle mirror 160 is disposed so as to split the subject light entering the imaging apparatus 100 into two light components. Moreover, the first and second image sensors 140 and 200 are disposed so as to receive the two split subject light components, respectively.

[Example of Layout of Light Receiving Elements in Second Image Sensor]

Figure 3:
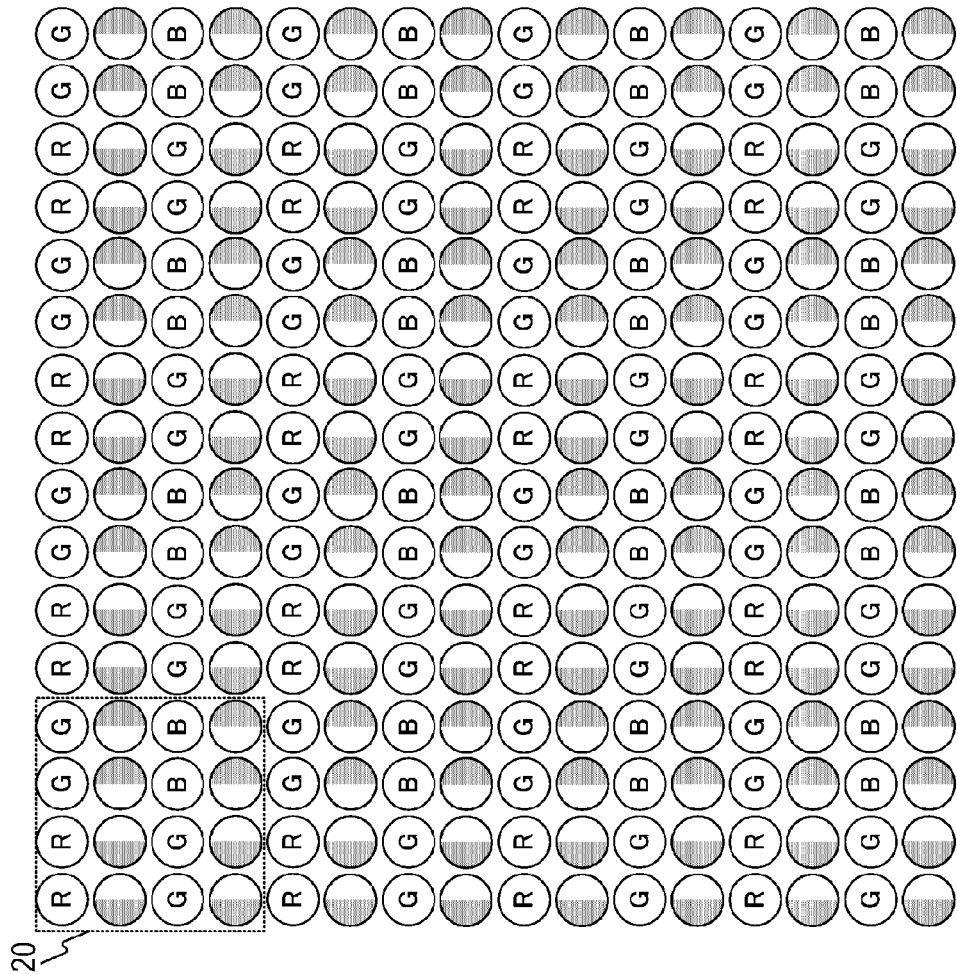
FIG. 3 is a schematic diagram showing an example of the arrangement of light receiving elements provided in a second image sensor in the first embodiment of the present disclosure.

FIG. 3 is a schematic diagram showing an example of the arrangement of light receiving elements provided in the second image sensor 200 in the first embodiment of the present disclosure.

In FIG. 3, an XY coordinate system in which the left and right direction is the Y-axis direction and the up and down direction is the X-axis direction will be considered. Moreover, in FIG. 3, the origin of the XY coordinate system is at the top left end, the up to down direction is the positive side of the X axis, and the left to right direction is the positive side of the Y axis. In addition, it is assumed that a signal readout direction in the second image sensor 200 is the X-axis direction (that is, signals are read out in units of rows).

In FIG. 3, for the sake of convenience, description will be made using a region (region 210) of light receiving elements (16-by-16 light receiving elements) which are part of the light receiving elements of the respective pixels constituting the second image sensor 200. In addition, the arrangement of light receiving elements in the second image sensor 200 is a arrangement in which the pixel arrangement shown in the region 210 is used as a unit, and the pixel arrangement (a pixel arrangement corresponding to the region 210) corresponding to this unit appears repeatedly in the X-axis direction and the Y-axis direction.

In FIG. 3, a pixel is depicted by a circle. Moreover, the image generation pixels are depicted by circles in which symbols (R, G, and B representing red, green, and blue) representing color filters provided therein are inserted. Furthermore, the phase-difference detection pixels are depicted by circles in which the side (gray semicircle) where incident light is blocked by a light blocking layer is painted.

Here, the arrangement of pixels in the second image sensor 200 will be described.

In the second image sensor 200, the row (line) of image generation pixels and the row (line) of phase-difference detection pixels alternate each other. That is, as shown in FIG. 3, image generation pixels, phase-difference detection pixels, image generation pixels, and phase-difference detection pixels alternate each other in the Y-axis direction.

Moreover, the image generation pixels are arranged so that two image generation pixels, in which color filters of the same color are arranged, are continuous to each other in the X-axis direction (in FIG. 3, for example, RR, GG, and BB are continuous to each other in the X-axis direction).

The phase-difference detection pixels are arranged so that two phase-difference detection pixels in which the same sides are blocked are continuous to each other in the X-axis direction (in FIG. 3, for example, left-left, right-right, left-left, and right-right are continuous to each other in the X-axis direction).

As described above, in the second image sensor 200, the line of image generation pixels and the line of phase-difference detection pixels alternate each other. With this configuration, when reading data from the second image sensor 200, it is possible to skip the line of phase-difference detection pixels which are not used for phase-difference detection.

Next, the pixels of the first embodiment of the present disclosure will be described with reference to FIG. 4, focusing on the pixels included in a region 220 (4-by-4 pixels).

[Example of Pixel Layout in Second Image Sensor]

Figure 4:
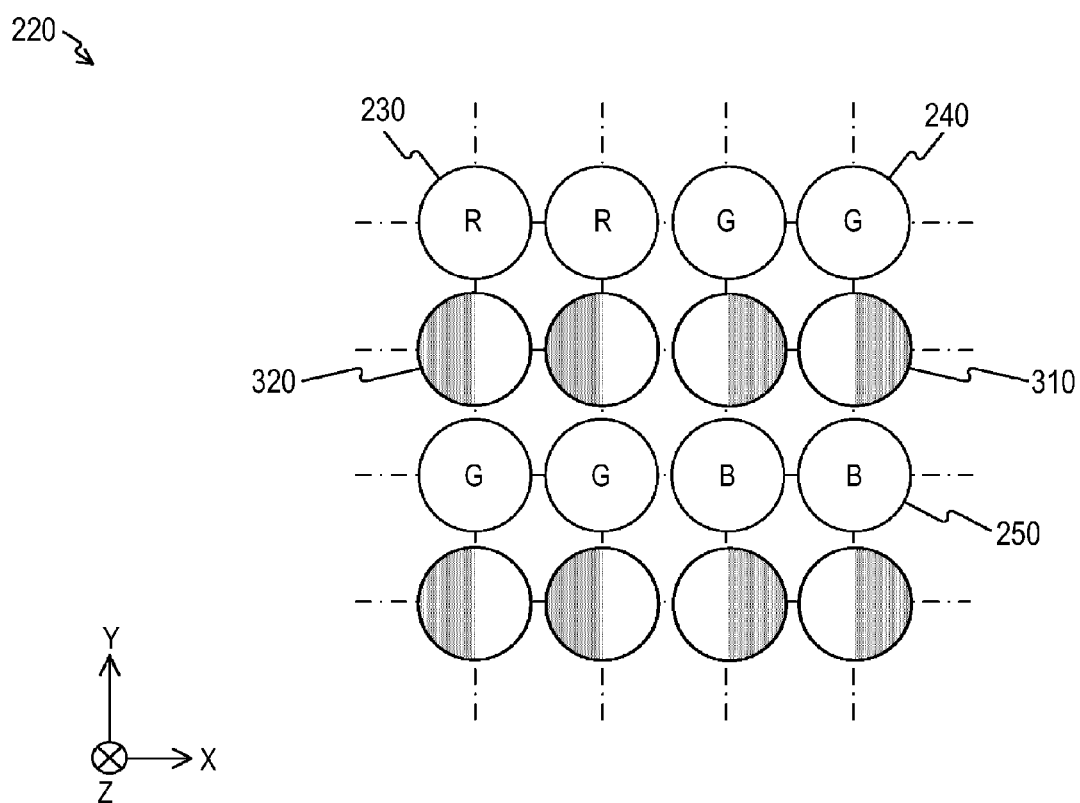
FIG. 4 is a top view schematically showing an example of the arrangement of pixels in a region of the second image sensor in the first embodiment of the present disclosure.

FIG. 4 is a top view schematically showing an example of the arrangement of pixels in the region 220 of the second image sensor 200 in the first embodiment of the present disclosure. In FIG. 4, an XY coordinate system in which the left and right direction is the X-axis direction and the up and down direction is the Y-axis direction will be considered. Moreover, it is assumed that the signal readout direction is the X-axis direction (that is, signals are read out in units of rows).

In FIG. 4, pixels corresponding to the region 220 in FIG. 3 are shown as the pixel arrangement of the second image sensor 200 in the first embodiment of the present disclosure. In FIG. 4, pixels (R pixels 230) that receive red (R) light using color filters that transmit red light and pixels (G pixels 240) that receive green (G) light using color filters that transmit green light are shown as the image generation pixels. Moreover, pixels (B pixels 250) that receive blue (B) light using color filters that transmit blue light are also shown as the image generation pixels. Furthermore, in FIG. 4, pixels (phase-difference detection pixels 310) in which the right sides are blocked and pixels (phase-difference detection pixels 320) in which the left sides are blocked are shown as the phase-difference detection pixels.

In the region 220 shown in FIG. 4, looking at the arrangement of only the image generation pixels excluding the line of phase-difference detection pixels, the arrangement becomes the Bayer arrangement in which the R pixel 230 is at the top left end, the G pixels 230 are at the top right and bottom left ends, and the B pixel 240 is at the bottom right end. That is, the arrangement of only the image generation pixels excluding the line of phase-difference detection pixels in the second image sensor 200 becomes a uniform Bayer arrangement. With this configuration, when generating images from the output signals from the second image sensor 200, it is possible to generate images through color compensation by the Bayer arrangement using two image generation pixels and two phase-difference detection pixels as one pixel unit. For example, when the second image sensor 200 includes 4592-by-3056 effective pixels (1528 rows for phase-difference detection pixels and 1528 rows for image generation pixels), 2296-by-1528 images are generated.

[Example of Incident Light Entering Phase-Difference Detection Pixel]

Figure 5A:
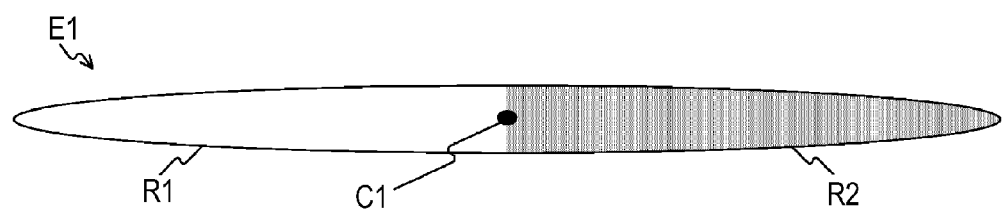
FIGS. 5A and 5B are schematic diagrams showing subject light received by a phase-difference detection pixel disposed near the center of the second image sensor in the first embodiment of the present disclosure.
Figure 5B:
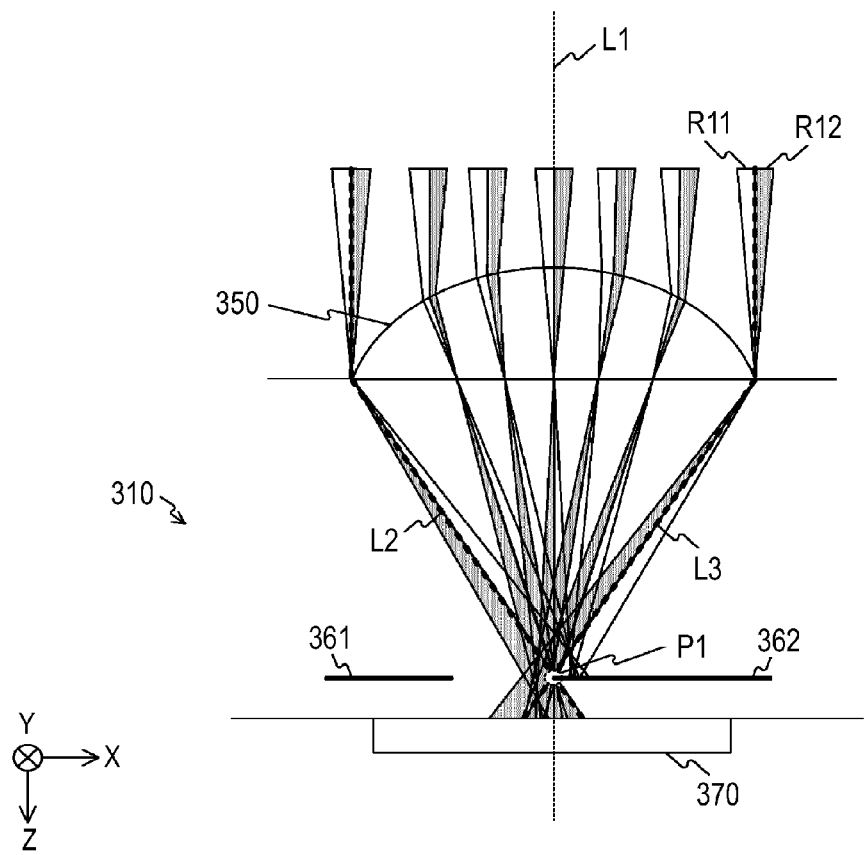

FIGS. 5A and 5B are schematic diagrams showing subject light received by a phase-difference detection pixel disposed near the center of the second image sensor 200 in the first embodiment of the present disclosure.

In FIGS. 5A and 5B, a cross-sectional configuration and an exiting pupil (exiting pupil E1) of the phase-difference detection pixel 310 disposed near the center of the second image sensor 200 are schematically shown. In FIGS. 5A and 5B, for the sake of convenience, it is assumed that the phase-difference detection pixel 310 does not have a color filter.

In FIGS. 5A and 5B, the cross-sectional configuration is shown when the left and right direction is the left and right direction (X-axis direction) of the phase-difference detection pixel 310 shown in FIG. 4. Moreover, in FIGS. 5A and 5B, the top to down direction is the positive direction of the Z axis.

In FIG. 5A, an exiting pupil E1 which is an image of a diaphragm in a light receiving element, the center (center C1) of the exiting pupil E1, the left half region (region R1) of the exiting pupil E1, and the right half region (region R2) of the exiting pupil E1 are shown.

In FIG. 5B, a light receiving element (light receiving element 370) of the phase-difference detection pixel 310 and light blocking layers (light blocking layers 361 and 362) blocking part of light entering the light receiving element 370 are shown as the cross-sectional view of the phase-difference detection pixel 310. Moreover, a microlens 350 that focuses light entering the phase-difference detection pixel 310 onto the light receiving element is shown as the cross-sectional view of the phase-difference detection pixel 310.

The light receiving element 370 is configured to generate an electrical signal indicating intensity corresponding to the amount of received light by converting (photoelectrically converting) the received light into an electrical signal. The light receiving element 370 is formed of a photodiode (PD), for example.

The light blocking layers 361 and 362 are configured to block incident light so that part of the subject light entering the light receiving element 370 through the microlens 350 is not received by the light receiving element 370. The light blocking layers 361 and 362 are disposed between the microlens 350 and the light receiving element 370. For example, the light blocking layers 361 and 362 are formed by extending a wiring for connecting respective circuits of the phase-difference detection pixel 310 to a position where it covers the light receiving element 370. The light blocking layer 362 is an example of a light blocking portion described in the appended claims.

The light blocking layer 362 is a light blocking layer that is disposed on the right side of the phase-difference detection pixel 310 and blocks a region extending from the right end of the phase-difference detection pixel 310 to the vicinity of the center of the light receiving element 370. That is, the light blocking layer 362 is disposed between the light receiving element 370 and the microlens 350 so as to cover the right half of the light receiving element 370.

On the other hand, the light blocking layer 361 is a light blocking layer that is disposed on the left side of the phase-difference detection pixel 301 and blocks only the vicinity of the left end of the light receiving element 370 so that the left half of the light receiving element 370 can receive the subject light.

Moreover, in the phase-difference detection pixel 310, part of the light entering the microlens 350 after passing through the region R1 is schematically depicted by a white region (region R11) including seven optical paths which schematically illustrate the subject light entering the phase-difference detection pixel 310. Part of the light entering the microlens 350 after passing through the region R2 is schematically depicted by a dotted region (region R12) including seven optical paths.

Here, the subject light received by the phase-difference detection pixel 310 that is disposed near the center of the second image sensor 200 will be described.

In the phase-difference detection pixel 310 disposed near the center of the second image sensor 200, the subject light (principal ray) having passed through the center C1 of the exiting pupil E1 enters the phase-difference detection pixel 310 as light that is parallel to the optical axis (optical axis L1) of the microlens 350. That is, in the phase-difference detection pixel 310 disposed near the center of the second image sensor 200, the principal ray is focused (imaged) at one point (principal ray image point P1) which is on the optical axis L1 of the microlens 350 and separated by a predetermined distance from the microlens 350.

Moreover, in the phase-difference detection pixel 310, the right half of the light receiving element 370 is blocked by the light blocking layers 361 and 362, and the left half of the light receiving element 370 is open. The light blocking layers 361 and 362 are disposed in the process of manufacturing the second image sensor 200 so that the principal ray image point P1 is located near the light receiving element-side end of the light blocking layer 362. That is, the phase-difference detection pixel 310 is manufactured so that the principal ray image point P1 which is the center of the image point (the image point of the subject light focused by the microlens 350) of the subject light entering through the exiting pupil E1 is located near the light receiving element-side end of the light blocking layer 362.

With this configuration, the incident light entering from the left half region (the region R1) of the exiting pupil E1 is blocked by the light blocking layer 362. On the other hand, the incident light entering from the right half region (the region R2) of the exiting pupil E1 is received by the light receiving element 370.

As described above, by setting the distance so that the principal ray image point P1 is located near the end of the light blocking layer 362, pupil-splitting of the subject light is performed accurately.

In FIGS. 5A and 5B, a line L2 shows the optical path of incident light on the leftmost side of the light entering the microlens 350 after passing through the center C1, and a line L3 shows the optical path of incident light on the rightmost side of the light entering the microlens 350 after passing through the center C1. The lines L2 and L3 are used in FIGS. 11A and 11B, and description thereof will be omitted here.

[Example of Incident Light Entering Image Generation Pixel]

Figure 6A:
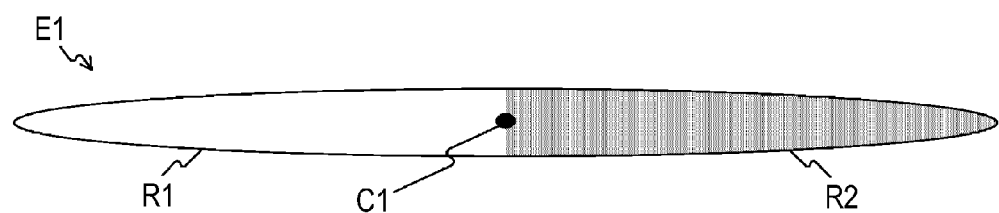
FIGS. 6A and 6B are schematic diagrams showing subject light received by an image generation pixel disposed near the center of the second image sensor in the first embodiment of the present disclosure.
Figure 6B:
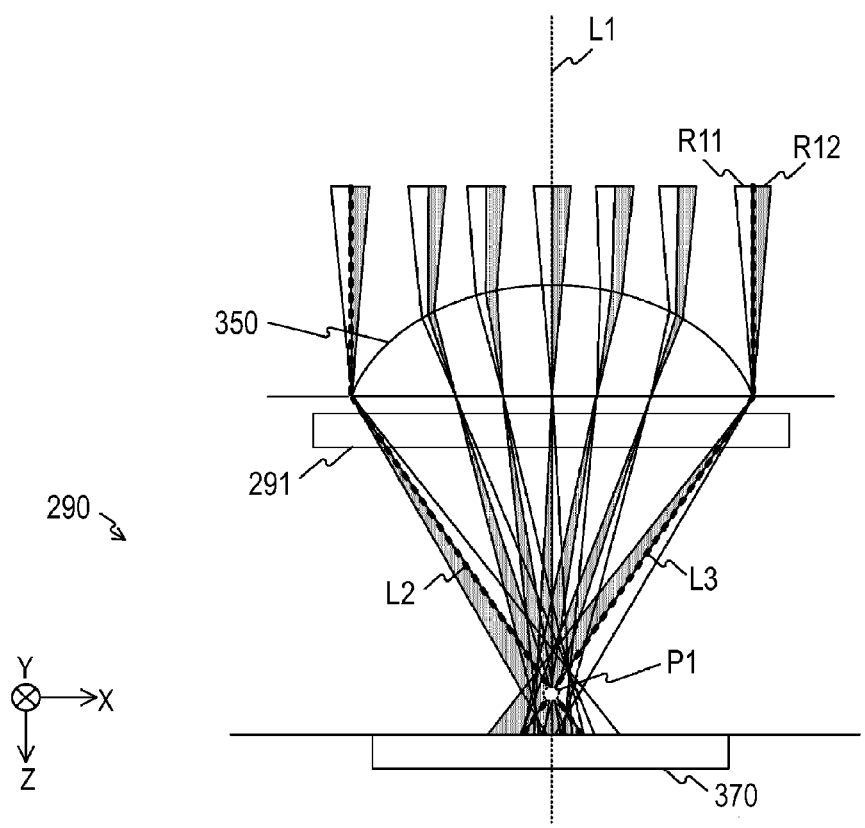

FIGS. 6A and 6B are schematic diagrams showing subject light received by an image generation pixel disposed near the center of the second image sensor 200 in the first embodiment of the present disclosure. In FIGS. 6A and 6B, description will be made considering an image generation pixel that is adjacent to the phase-difference detection pixel 310 shown in FIGS. 5A and 5B.

In FIGS. 6A and 6B, since the difference between the R pixel 230, the G pixel 240, and the B pixel 250 in the second image sensor 200 lies only in the color filter, these image generation pixels will be depicted as an image generation pixel (image generation pixel 290) that has a color filter 291.

In FIG. 6A, the exiting pupil E1, the center (center C1) of the exiting pupil E1, the left half region (region R1) of the exiting pupil E1, and the right half region (region R2) of the exiting pupil E1 are shown similarly to FIG. 5A.

FIG. 6B schematically shows the cross-sectional configuration of the image generation pixel 290 that is disposed near the center of the second image sensor 200. In addition, since the image generation pixel 290 has the same configuration as the phase-difference detection pixel 310 except that it does not have the light blocking layers 361 and 362 of the phase-difference detection pixel 310 shown in FIGS. 5A and 5B, the same configurations will be denoted by the same reference numerals, and description thereof will be omitted here. That is, the image generation pixel 290 disposed near the center of the second image sensor 200 includes the microlens 350 and the light receiving element 370 which are the same as those of the phase-difference detection pixel 310.

Since the image generation pixel 290 has the same microlens 350 as the phase-difference detection pixel 310, the optical paths of the incident light are the same as those of the adjacent phase-difference detection pixel 310. Moreover, the distance (M-P distance) between the microlens 350 and the light receiving element 370 in the image generation pixel 290 is approximately the same as the distance in the adjacent phase-difference detection pixel 310. That is, the M-P distance in the image generation pixel 290 shown in FIGS. 6A and 6B is approximately the same as the M-P distance in the phase-difference detection pixel 310 shown in FIGS. 5A and 5B.

Here, the subject light received by the image generation pixel 290 that is disposed near the center of the second image sensor 200 will be described.

Since the image generation pixel 290 has no light blocking layer, the light receiving element 370 of the image generation pixel 290 receives both the incident light entering from the left half region (the region R1) of the exiting pupil E1 and the incident light entering from the right half region (the region R2) of the exiting pupil E1. In addition, since the M-P distance in the image generation pixel 290 is approximately the same as the M-P distance in the phase-difference detection pixel 310 shown in FIGS. 5A and 5B, the image point of the principal ray is on the front side (on the side of the microlens 350 in the Z-axis) of the light receiving element 370. However, since all light components focused by the microlens 350 are received by the light receiving element 370, there is substantially no determination in the quality of images resulting from this.

As described above, the same microlens is provided to the phase-difference detection pixel and the image generation pixel. Moreover, the M-P distances in the phase-difference detection pixel and the image generation pixel which are adjacent to each other are approximately the same.

[Example of Focusing Position of Principal Ray]

Figure 7A:
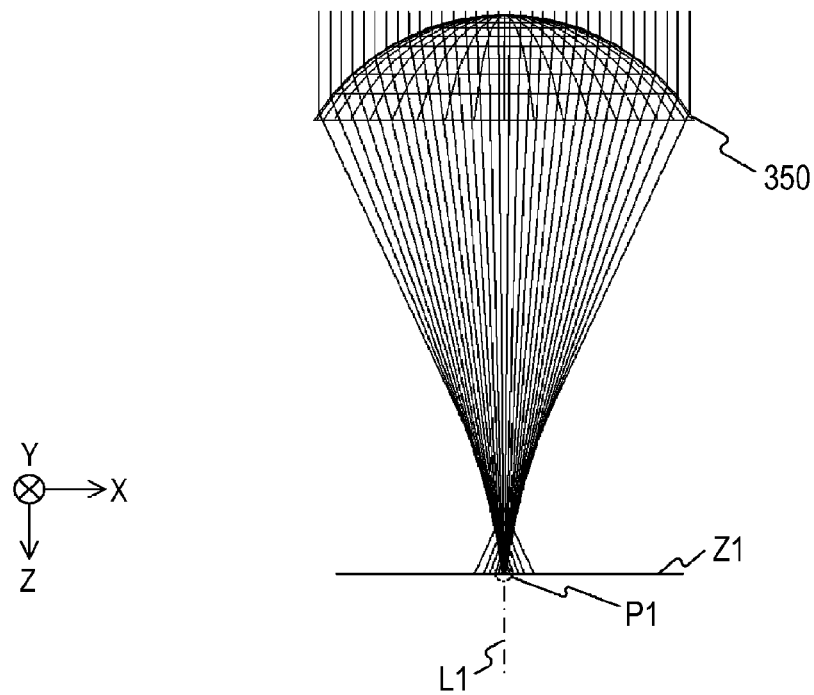
FIGS. 7A and 7B are schematic diagrams showing examples of the focusing position (principal ray image point) when a principal ray entering a microlens in the first embodiment of the present disclosure is parallel to, or oblique to, the optical axis of the microlens.
Figure 7B:
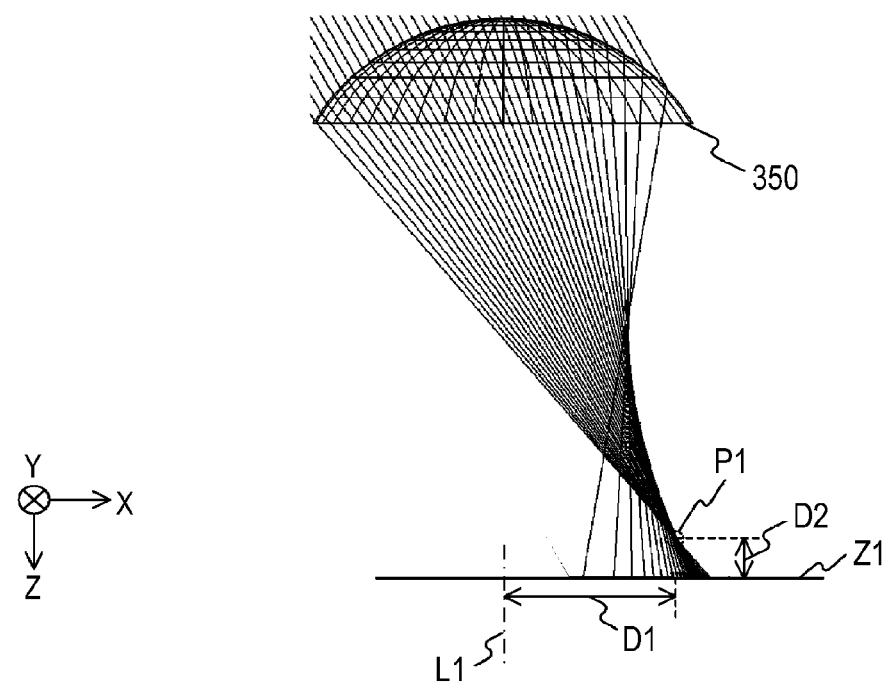

FIGS. 7A and 7B are schematic diagrams showing examples of the focusing position (principal ray image point) when a principal ray entering the microlens 350 in the first embodiment of the present disclosure is parallel to, or oblique to, the optical axis of the microlens 350.

FIG. 7A shows the position of the principal ray image point P1 when the principal ray entering the microlens 350 is parallel to the optical axis of the microlens 350.

FIG. 7A shows the microlens 350, the optical axis L1 of the microlens 350, the principal ray parallel to the optical axis L1, the image point (principal ray image point P1) of the principal ray parallel to the optical axis L1, and a line Z1 indicating the position of the principal ray image point P1 on the Z-axis.

As shown in FIG. 7A, when the principal ray entering the microlens 350 is parallel to the optical axis of the microlens 350, the principal ray is focused at a predetermined position (the principal ray image point P1) on the optical axis L1.

FIG. 7B shows the position of the image point when the principal ray entering the microlens 350 is oblique to the optical axis of the microlens 350.

Similarly to FIG. 7A, FIG. 7B shows the microlens 350, the optical axis L1, the principal ray that is oblique to the optical axis L1, the image point (the principal ray image point P1) of the principal ray oblique to the optical axis L1, and the line Z1.

Since the principal ray is oblique to the optical axis L1, the principal ray is focused (imaged) at a position separated from the optical axis L1. In FIG. 7B, the principal ray is focused (imaged) at a position shifted rightward by about a distance D1 from the optical axis L1. In addition, the principal ray is focused at a position that is shifted toward the microlens 350 by about a distance D2 in the Z-axis direction.

As described above, when the principal ray is oblique to the optical axis L1 of the microlens 350, the focusing position (the principal ray image point) is shifted in the horizontal direction as well as in the vertical direction. That is, when the principal ray is oblique to the optical axis L1 of the microlens 350, the principal ray image point is shifted in a direction away from the optical axis L1 in the horizontal direction as well as in a direction closer to the microlens 350 in the vertical direction as compared to when the principal ray is parallel to the optical axis L1.

[Example of Relationship Between Image Height and Principal Ray Image Point]

Figure 8A:
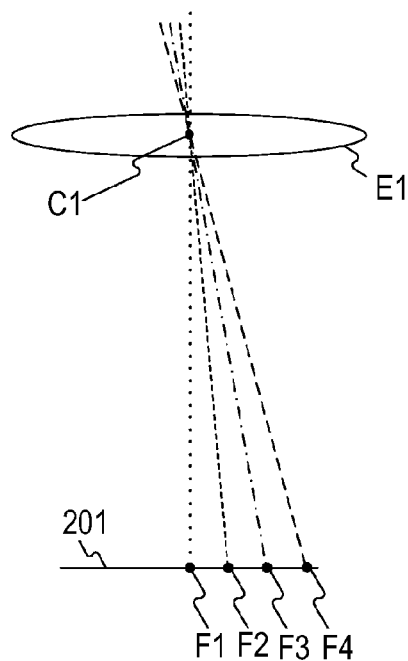
FIGS. 8A and 8B are schematic diagrams showing examples of the principal ray image point when the incidence angle of the principal ray entering the microlens in the first embodiment of the present disclosure is changed.
Figure 8B:
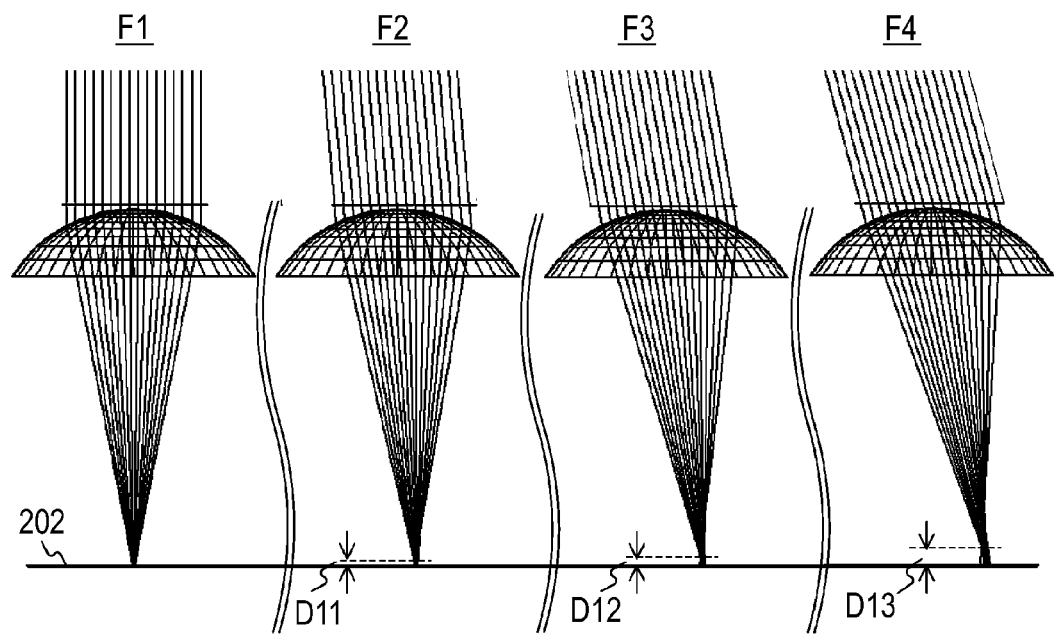

FIGS. 8A and 8B are schematic diagrams showing examples of the principal ray image point when the incidence angle of the principal ray entering the microlens 350 in the first embodiment of the present disclosure is changed.

FIG. 8A schematically shows an example of the incidence angle of the principal ray when the position of the principal ray on a light receiving surface (light receiving surface 201) of the second image sensor 200 is changed. FIG. 8A shows the exiting pupil E1, a line (the light receiving surface 201) schematically indicating the light receiving surface of the second image sensor 200, predetermined positions (positions F1 to F4) on the light receiving surface 201, and the principal rays (lines passing through the center C1) corresponding to the positions F1 to F4.

The position F1 is the position on the light receiving surface 201 through which the principal ray (incidence angle is 0°) parallel to the optical axis of the exiting pupil E1 passes. The position F2 is the position through which the principal ray oblique to the optical axis at about 5° passes, the position F3 is the position through which the principal ray oblique to the optical axis at about 10° passes, and the position F4 is the position through which the principal ray oblique to the optical axis at about 15° passes.

The image points of the principal rays on the microlens 350, disposed at the positions F1 to F4 will be described with reference to FIG. 8B.

FIG. 8B schematically shows the image points of the principal rays on the pixels disposed at the positions F1 to F4 shown in FIG. 8A. FIG. 8B shows a line 202 indicating the position in the up and down direction (the Z-axis direction) of the image points of the rays of light focused by the microlens 350 of the pixel disposed at the position F1 and distance differences D11 to D13 representing the differences to the line 202. The distance difference D11 represents the difference between the position of the focused ray image point at the position F2 and the line 202, the distance difference D12 represents the difference between the position of the focused ray image point at the position F3 and the line 202, and the distance difference D13 represents the difference between the position of the focused ray image point at the position F4 and the line 202.

As shown in FIG. 8B, the principal ray image point approaches the microlens as the incidence angle of the principal ray to the optical axis increases. That is, in the second image sensor 200, the amount of shift (M-directional shift amount) of the position of the principal ray image point toward the microlens 350 increases as the image height increases (as it is farther from the center of the image sensor).

[Example of Relationship Between Image Height and Amount of Shift of Image Point Toward Microlens]

Figure 9:
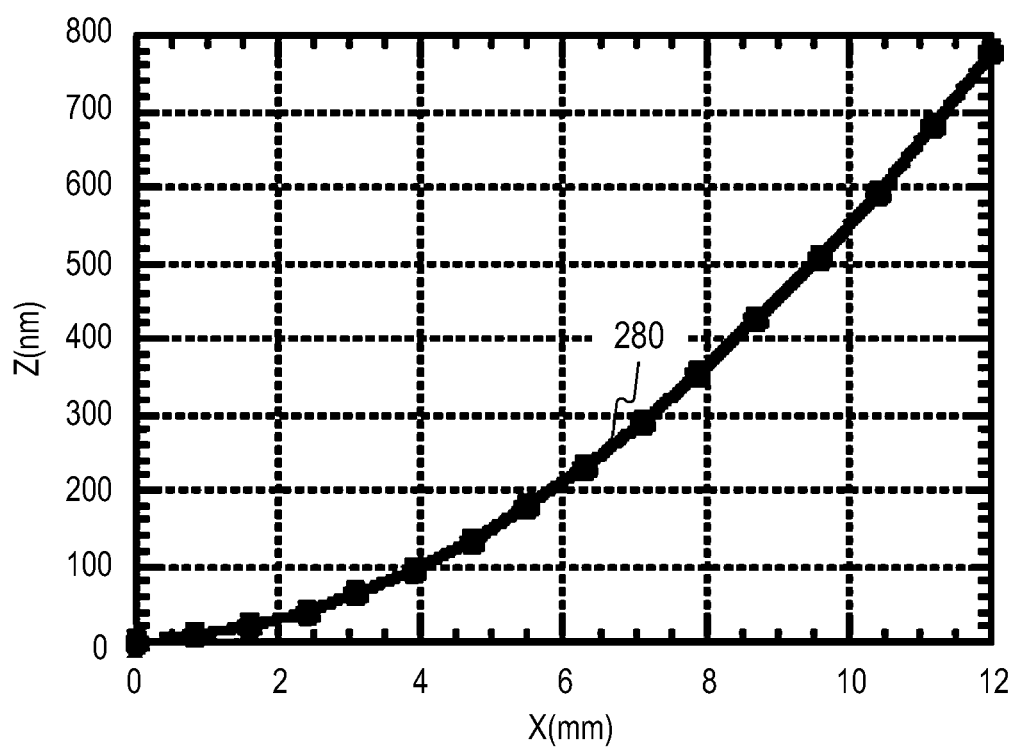
FIG. 9 is a graph showing the relationship between an image height of the second image sensor in the first embodiment of the present disclosure and the amount of shift (M-directional shift amount) toward the microlens, of the image point of the principal ray on a pixel disposed at each image height position.

FIG. 9 is a graph showing the relationship between an image height of the second image sensor 200 in the first embodiment of the present disclosure and the amount of shift (M-directional shift amount) toward the microlens 350, of the image point of the principal ray on a pixel disposed at each image height position.

In FIG. 9, the second image sensor 200 of which the size in the horizontal direction (the X-axis direction) is 24 mm (the maximum image height is 12 mm) will be considered as an example. Moreover, it is assumed that the radius of curvature of the microlens 350 is 4 μm, and the distance between the exiting pupil and the second image sensor 200 is about 45 mm.

In FIG. 9, the horizontal axis represents the image height in the horizontal direction (X-axis direction) of the second image sensor 200, and the vertical axis represents the M-directional shift amount. FIG. 9 shows image point shift characteristics (image point shift characteristic curve 280) representing the shift amount of the principal ray image point corresponding to the image height.

The image point shift characteristic curve 280 shows the shift amount (M-directional shift amount) toward the microlens, of the position of the image point at each image height when a reference position is set to the position of the image point of the principal ray focused by the microlens 350 on a pixel of which the image height is disposed at 0 mm (the center of the second image sensor 200).

A relational equation derived through fitting the image point shift characteristic curve 280 is Equation (1) below.

$$D = 5.5 \times H + 5.0 \times H^2 \quad (1)$$

Here, D is the M-directional shift amount (nm). Moreover, H is the image height (mm).

As shown in Equation 1 above, the M-directional shift amount increases with the image height.

[Example of Relationship Between Microlens and Light Blocking Layer in Second Image Sensor]

Figure 10A:
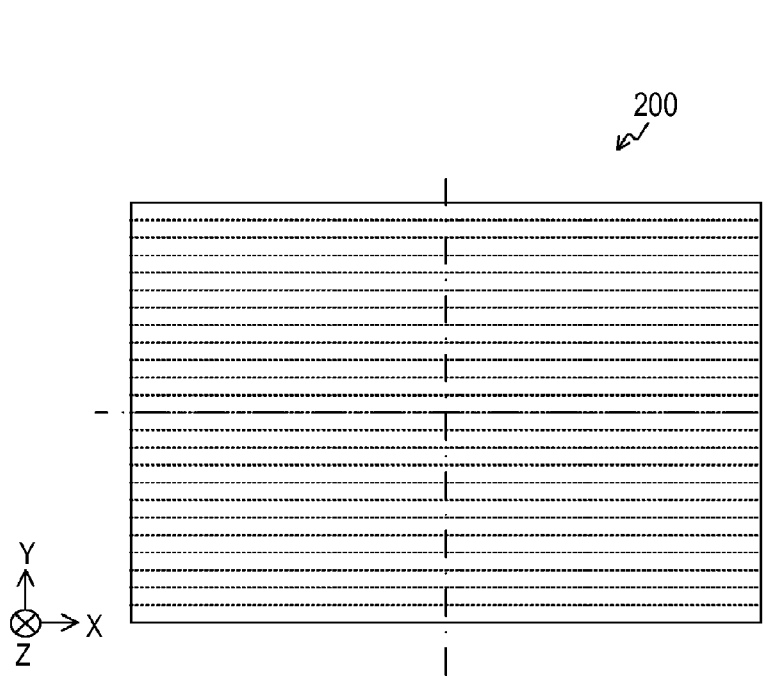
FIGS. 10A to 10C are schematic diagrams showing the relationship between the distance between a microlens and a light blocking layer and the image height in the second image sensor of the first embodiment of the present disclosure.
Figure 10C:
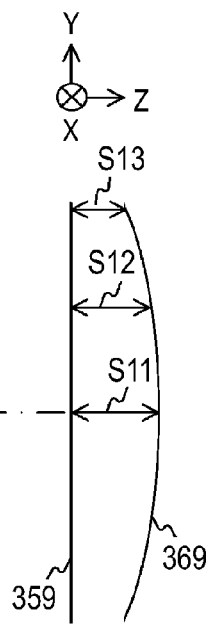
Figure 10B:
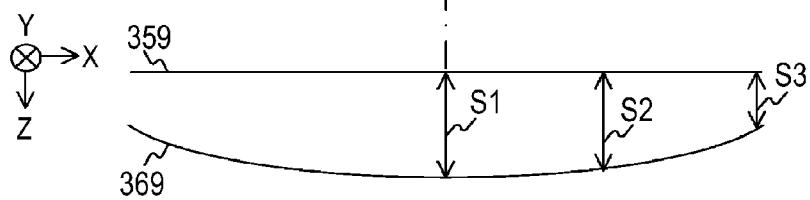

FIGS. 10A to 10C are schematic diagrams showing the relationship between the distance between a microlens and a light blocking layer and the image height in the second image sensor 200 of the first embodiment of the present disclosure. In the drawings subsequent to FIGS. 10A to 10C, the distance between the microlens and the light blocking layer will be referred to as an "M-S distance," and the relation between the M-S distance and the image height will be referred to as an "M-S distance relation."

FIG. 10A shows the second image sensor 200 in which the lines (rows) of phase-difference detection pixels are schematically depicted by a plurality of broken lines. The M-S distance relation in the horizontal direction (X-axis direction) of the second image sensor 200 is shown in FIG. 10B, and the M-S distance relation in the vertical direction (Y-axis direction) is shown in FIG. 10C.

FIG. 10B schematically shows the M-S distance relation in the X-axis direction of the second image sensor 200. FIG. 10B shows a microlens position 359 indicating the position of the layer of the microlens 350 in the second image sensor 200 and a light blocking layer position 369 indicating the position of the light blocking layer. Moreover, FIG. 10B shows distances S1 to S3 indicating the M-S distance relations at three image heights of the second image sensor 200.

The second image sensor 200 is designed so that the position of the light blocking layer increases (the light blocking layer approaches the microlens) as the image height increases in order to cope with the positional shift of the image point with the image height. For example, the position of the light blocking layer in the second image sensor 200 is designed so as to satisfy the relation of Equation 1 above. Moreover, the second image sensor 200 is manufactured so that the positions of the microlenses 350 of the respective pixels are the same in the Z-axis direction as shown in the microlens position 359. Therefore, the M-S distance relation satisfies S1>S2>S3 as shown in FIG. 10B, for example.

Here, a case in which Equation 1 above is applied to the second image sensor 200 of which the size in the X-axis direction is 24 mm will be considered. In this case, a distance in the Z-axis direction between the light blocking layer of the phase-difference detection pixel 310 disposed at the center (image height: 0 mm) and the light blocking layer of the phase-difference detection pixel 310 disposed at the end (image height: 12 mm) in the X-axis direction of the second image sensor 200 is 800 nm.

FIG. 10C schematically shows the M-S distance relation in the Y-axis direction of the second image sensor 200. In the Y-axis direction, the second image sensor 200 is also designed so that the position of the light blocking layer approaches the microlens as the image height increases. With this configuration, the M-S distance relation satisfies S11>S12>S13 as shown in FIG. 10C, for example.

[Example of Position of Light Blocking Layer in Phase-Difference Detection Pixel]

Figure 11A:
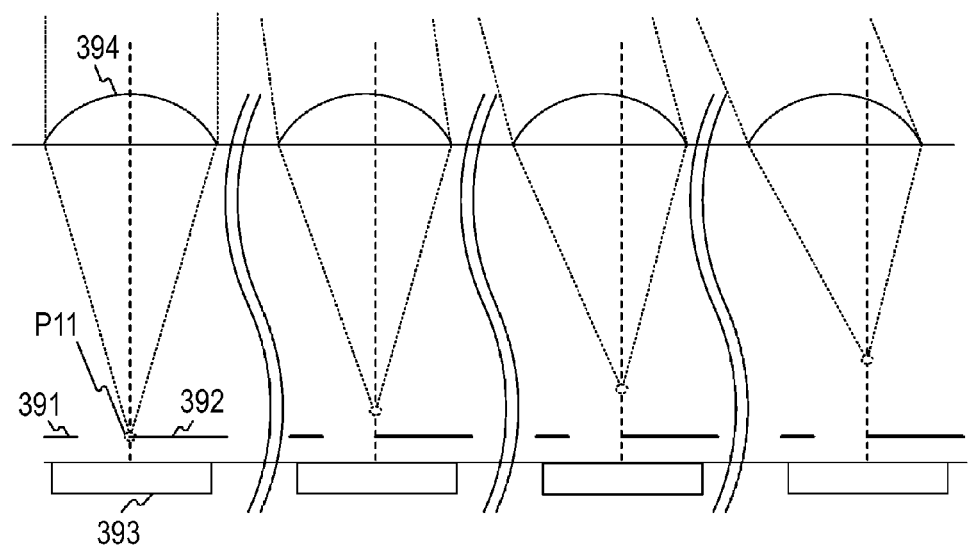
FIGS. 11A and 11B are diagrams showing an example of a light blocking layer of a phase-difference detection pixel in the first embodiment of the present disclosure and an example of a light blocking layer of a phase-difference detection pixel in an image sensor according to the related art in which both an image generation pixel and a phase-difference detection pixel are provided.
Figure 11B:
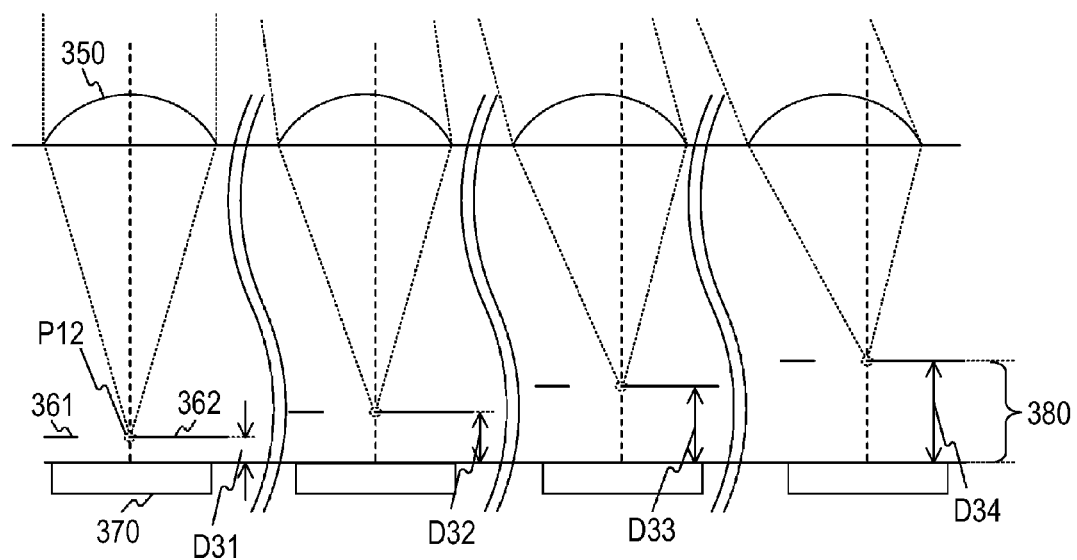

FIGS. 11A and 11B are diagrams showing an example of a light blocking layer of the phase-difference detection pixel 310 in the first embodiment of the present disclosure and an example of a light blocking layer of a phase-difference detection pixel in an image sensor according to the related art in which both an image generation pixel and a phase-difference detection pixel are provided.

FIG. 11A shows phase-difference detection pixels at four positions of an image sensor of the related art in which both an image generation pixel and a phase-difference detection pixel are provided and the image points of principal rays of light focused by the microlenses of the phase-difference detection pixels. In FIG. 11A, a phase-difference detection pixel disposed near the center of the image sensor is shown on the leftmost side, and a phase-difference detection pixel disposed near the end (for example, the right end) of the image sensor is shown on the rightmost side. Moreover, phase-difference detection pixels at two positions between the center and the end of the image sensor are shown between the phase-difference detection pixel at the left end and the phase-difference detection pixel at the right end in the order of their arrangement. Furthermore, in FIG. 11A, light blocking layers 391 and 392, a light receiving element 393, and a microlens 394 are shown as the configurations of the phase-difference detection pixel. Furthermore, rays of light passing through the left and right ends of the microlens 394 among the principal rays of light entering each of the microlenses 394 are depicted by broken lines passing from the microlens 394 to the image point of the principal ray. In addition, the image point (principal ray image point P11) of the principal rays of light entering each of the microlenses 394 is depicted at the crossing point of the broken lines.

Moreover, in the image sensor of the related art, since light focused by the microlens is received by the light receiving element of the image generation pixel without leaking, the position of the microlens with respect to the light receiving element is shifted toward the center of the image sensor as the image height increases. In FIG. 11A, similarly to the image generation pixel, the position of the microlens in the phase-difference detection pixel is depicted as being shifted toward the center of the image sensor as the image height increases.

As shown in FIG. 11A, in the image sensor of the related art, the distance between the microlens and the light blocking layer is constant regardless of the position of the phase-difference detection pixel in the image sensor. Therefore, the positions of the image point P11 and the light blocking layer change with the image height.

FIG. 11B shows phase-difference detection pixels 310 at four positions of the second image sensor 200 and the image points of principal rays of light focused by the microlenses 350 of the phase-difference detection pixels 310. In FIG. 11B, for comparison with FIG. 11A, the phase-difference detection pixel 310 disposed near the center of the second image sensor 200 is shown on the left end, and the phase-difference detection pixel 310 disposed near the end (for example, the right end) of the second image sensor 200 is shown on the right end. Moreover, phase-difference detection pixels 310 at two positions between the center and the end of the second image sensor 200 are shown between the phase-difference detection pixel 310 at the left end and the phase-difference detection pixel 310 at the right end in the order of their arrangement.

In addition, since the respective configurations of the phase-difference detection pixel 310 shown in FIG. 11B are the same as those of the phase-difference detection pixel 310 shown in FIG. 5B, the configurations will be denoted by the same reference numerals, and description thereof will be omitted here. Moreover, in FIG. 11B, a distance adjustment layer 380 which is the layer between the light receiving element 370 and the light blocking layer is depicted together with distances D31 to D34 representing the thickness of the distance adjustment layer 380 in each of the phase-difference detection pixels 310. Furthermore, rays of light passing through the left and right ends of the microlens 350 among the principal rays of light entering each of the microlenses 350 are depicted by broken lines passing from the microlens 350 to the image point of the principal ray. The broken lines correspond to the lines L2 and L3 shown in FIG. 5B. In addition, the image point (principal ray image point P12) of the principal rays of light entering the microlens 394 is depicted at the crossing point of the broken lines.

The distance adjustment layer 380 is a layer that adjusts the distance between the light blocking layer and the light receiving element. The distance adjustment layer 380 is a transparent layer which is disposed between the layer of the wiring serving as the light blocking layer and the light receiving element, and of which the thickness increases gradually from the center of the second image sensor 200 toward the periphery. For example, the distance adjustment layer 380 is formed so that the position of the light blocking layer approaches the microlens as the image height increases so as to comply with the characteristics shown in FIG. 9. That is, in the step of manufacturing the transparent layer between the light receiving element and the light blocking layer (wiring layer) during the process of manufacturing the second image sensor 200, the transparent layer is manufactured so that the thickness thereof increases gradually from the center of the second image sensor 200 toward the periphery.

When the distance adjustment layer 380 is manufactured by a vacuum thin-film deposition process, for example, a method in which in-plane thickness distribution is adjusted by a light blocking plate or the like so that the thickness (thickness of the transparent layer) decreases as it approaches the center of the second image sensor 200 may be considered. Moreover, when the distance adjustment layer 380 is manufactured by a spin-coat deposition process, a method in which the rotation speed is adjusted so that the thickness decreases as it approaches the center of the second image sensor 200 may be considered. By manufacturing the transparent layer in this way, it is possible to increase the distance between the light blocking layer and the light receiving element with an increase in the image height without adding complex steps to the image sensor manufacturing process of the related art.

Moreover, in a step of manufacturing a transparent layer after the light blocking layer is manufactured, the transparent layer is manufactured so that the surface (the side of the microlens in the Z-axis direction) of the transparent layer being manufactured is planarized. In this way, as shown in FIG. 11B, the microlenses 350 of the respective pixels are disposed on the same plane. That is, the distance between the microlens and the light receiving element of each pixel in the second image sensor 200 is approximately constant.

As described above, in the second image sensor 200, the distance between the microlens and the light blocking layer changes with the position of the image point of the principal ray. That is the light blocking layer is disposed so that the distance between the light blocking layer and the microlens in the optical axis direction of the microlens decreases as the image height increases. Therefore, the position of the principal ray image point P12 is always at the height of the light blocking layer regardless of the image height.

Moreover, as shown in FIG. 11B, the position of the microlens 350 with respect to the light receiving element 370 in the phase-difference detection pixel 310 is shifted toward the center of the second image sensor 200 so that the position of the principal ray image point is located near the end of the light blocking layer 362 closer to the light receiving element. For example, as shown in FIG. 11B, in the phase-difference detection pixel 310 (the leftmost pixel in the drawing) disposed at the center of the second image sensor 200, the centers of the microlens 350 and the light receiving element 370 are identical. Moreover, in the phase-difference detection pixels 310 which are disposed from the second positions from the left end to the right end, the position of the microlens 350 is shifted toward the center of the second image sensor 200 with the image height so that the position of the principal ray image point is located near the end of the light blocking layer 362 closer to the light receiving element. Therefore, the position of the principal ray image point P12 is always located near the end of the light blocking layer closer to the light receiving element regardless of the image height.

[Example of Incident Light Entering Phase-Difference Detection Pixel Near End of Second Image Sensor]

Figure 12A:
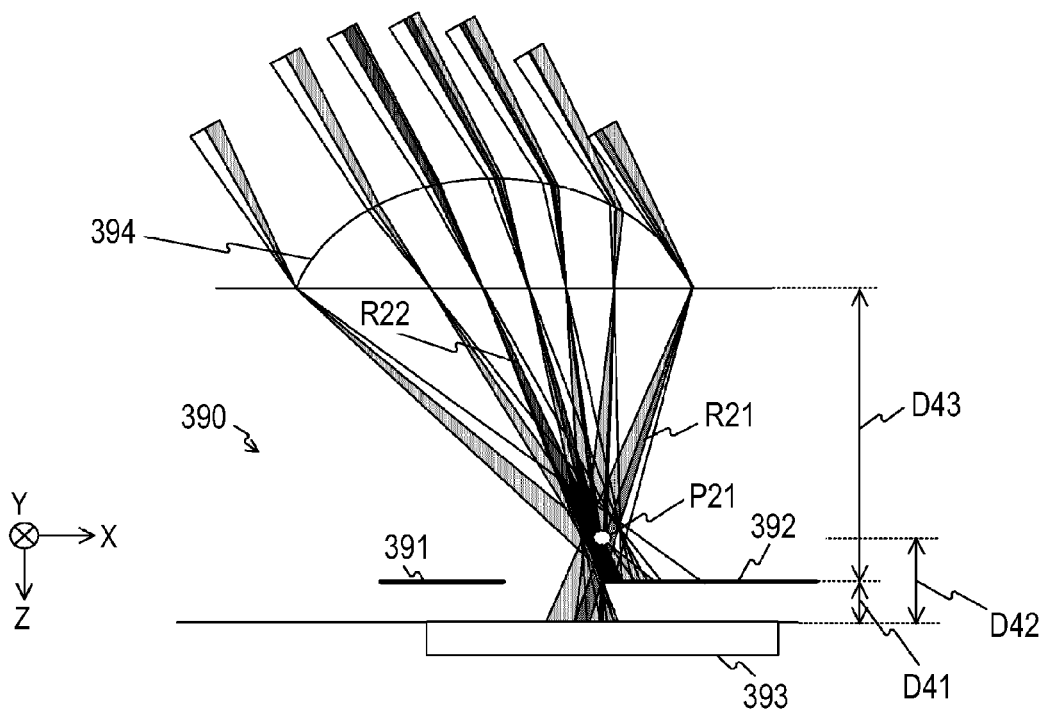
FIGS. 12A and 12B are diagrams showing an example of incident light entering a phase-difference detection pixel disposed near the end of the second image sensor in the first embodiment of the present disclosure and an example of incident light entering the phase-difference detection pixel disposed near the end of the image sensor of the related art.
Figure 12B:
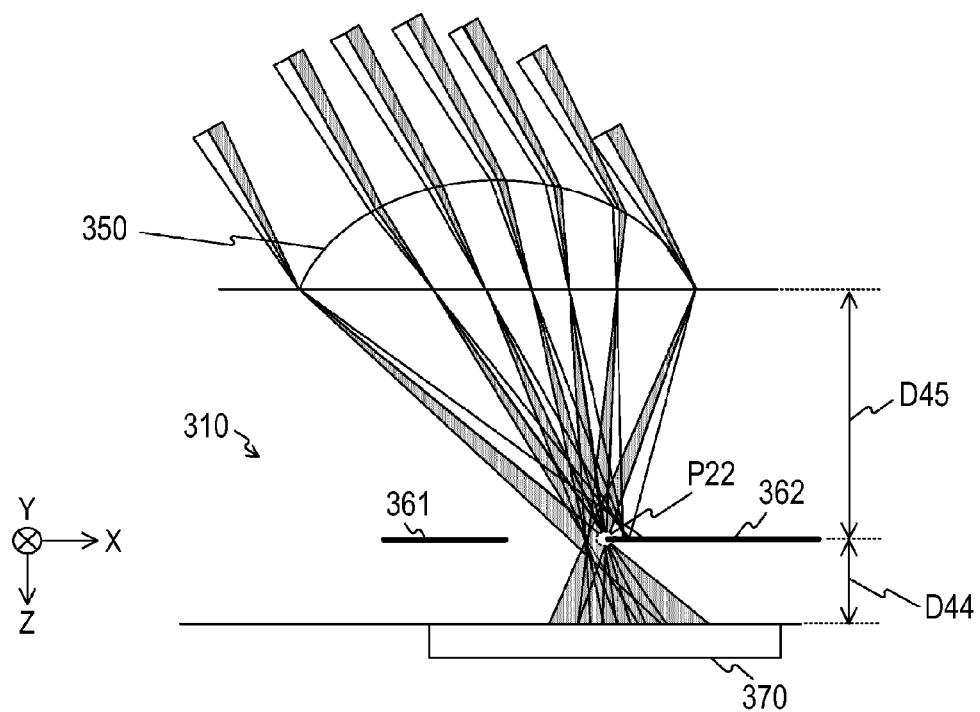

FIGS. 12A and 12B are diagrams showing an example of incident light entering the phase-difference detection pixel 310 disposed near the end of the second image sensor 200 in the first embodiment of the present disclosure and an example of incident light entering the phase-difference detection pixel disposed near the end of the image sensor of the related art.

FIG. 12A shows an example of incident light entering the phase-difference detection pixel disposed near the end of the image sensor of the related art. Here, in FIG. 12A, it is assumed that in the phase-difference detection pixel at the center of the image sensor, the distance between the microlens and the light blocking layer at the principal ray image point is approximately identical to that near the end of the light blocking layer closer to the light receiving element.

In FIG. 12A, the cross-sectional configuration of the phase-difference detection pixel (phase-difference detection pixel 390) disposed near the end of the image sensor of the related art is depicted together with subject light entering the phase-difference detection pixel 390. Moreover, in the cross-sectional configuration, the subject light entering from the exiting pupil, the image point (principal ray image point P21) of the principal ray among the subject light, and the distance (P-S distance D41) between the light receiving element and the light blocking layer are depicted. Furthermore, the distance (M-S distance D43) between the microlens and the light blocking layer and the distance (P-I distance D42) between the light receiving element and the principal ray image point are shown.

In the image sensor of the related art, the P-S distance D41 and the S-M distance D43 are the same distances in all phase-difference detection pixels of the image sensor. Therefore, when the image point and the height of the light blocking layer are made approximately identical to each other in the phase-difference detection pixel at the center of the image sensor, the image point in the phase-difference detection pixel disposed near the end of the image sensor is shifted between the light blocking layer and the microlens.

Therefore, the subject light having passed through the left half of the exiting pupil is not completely blocked by the light blocking layer 392, but part of the light is received by the light receiving element 393. In FIG. 12A, the subject light which is not blocked but is received by the light receiving element 393 among the subject light having passed through the left half of the exiting pupil is depicted by a large dotted region (region R21).

On the other hand, the entire subject light having passed through the right half of the exiting pupil does not pass through the opening portion between the light blocking layer 391 and the light blocking layer 392, but part of the light is blocked by the light blocking layer 392. In FIG. 12A, the subject light which is blocked by the light blocking layer 392 among the subject light having passed through the right half of the exiting pupil is depicted by a dark region (region R22) with white dots.

As described above, in the image sensor of the related art, the degree of splitting of the subject light by the phase-difference detection pixel changes in accordance with the position of the phase-difference detection pixel in the image sensor. Therefore, phase-difference detection pixels which may not be possible to split the subject light exactly into two components are disposed in the image sensor. Accordingly, the phase-difference characteristics become uneven, and the accuracy of phase-difference detection deteriorates.

FIG. 12B shows the cross-sectional configuration of the phase-difference detection pixel 310 disposed near the end of the second image sensor 200. Moreover, in the cross-sectional configuration, the subject light entering from the exiting pupil, the image point (principal ray image point P22) of the principal ray among the subject light, the distance (P-S distance D44) between the light receiving element and the light blocking layer, and the distance (M-S distance D45) between the microlens and the light blocking layer are depicted.

In the second image sensor 200, the thickness of the distance adjustment layer 380 changes in accordance with a shift of the image point in the phase-difference detection pixel 310, whereby the P-S distance D44 and the M-S distance D45 are adjusted. Therefore, in all phase-difference detection pixels 310 of the second image sensor 200, the subject light having passed through the left half of the exiting pupil is completely blocked by the light blocking layer 362, and the entire subject light having passed through the right half of the exiting pupil is received by the light receiving element 370.

[Example of Incident Light Entering Image Generation Pixel Near End of Second Image Sensor]

Figure 13:
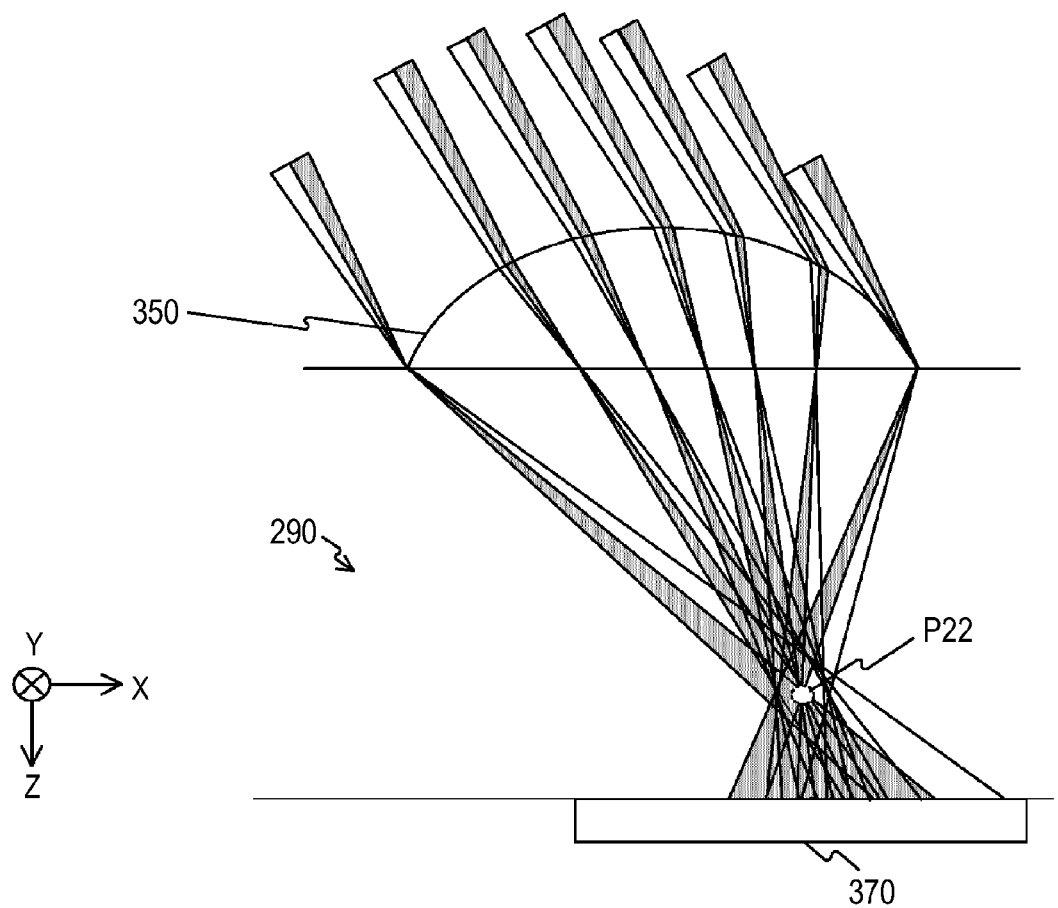
FIG. 13 is a diagram showing an example of incident light entering an image generation pixel disposed near the end of the second image sensor in the first embodiment of the present disclosure.

FIG. 13 is a diagram showing an example of incident light entering the image generation pixel 290 disposed near the end of the second image sensor 200 in the first embodiment of the present disclosure.

In the second image sensor 200, the same microlenses 350 are disposed in the phase-difference detection pixel 310 and the image generation pixel 290. In the image generation pixel 290, although the image point of the principal ray is on the front side (on the side of the microlens 350 in the Z-axis) of the light receiving element 370, the entire subject light focused by the microlens 350 is received by the light receiving element 370.

Although the phase-difference detection pixel 310 and the image generation pixel 290 have been described hereinabove, the same is applied to the phase-difference detection pixel 320. In the phase-difference detection pixel 320, the light blocking layer 361 blocks a region extending from the left end of the phase-difference detection pixel 310 to the vicinity of the center of the light receiving element 370, and the light blocking layer 362 blocks only the vicinity of the right end of the light receiving element 370. That is, in the phase-difference detection pixel 320, the thickness of the distance adjustment layer 380 changes, whereby the subject light having passed through the right half of the exiting pupil is completely blocked by the light blocking layer 361, and the entire subject light having passed through the left half of the exiting pupil is received by the light receiving element 370.

[Example of Relationship Between Image Height and Pupil-Splitting in the Second Image Sensor]

Figure 14:
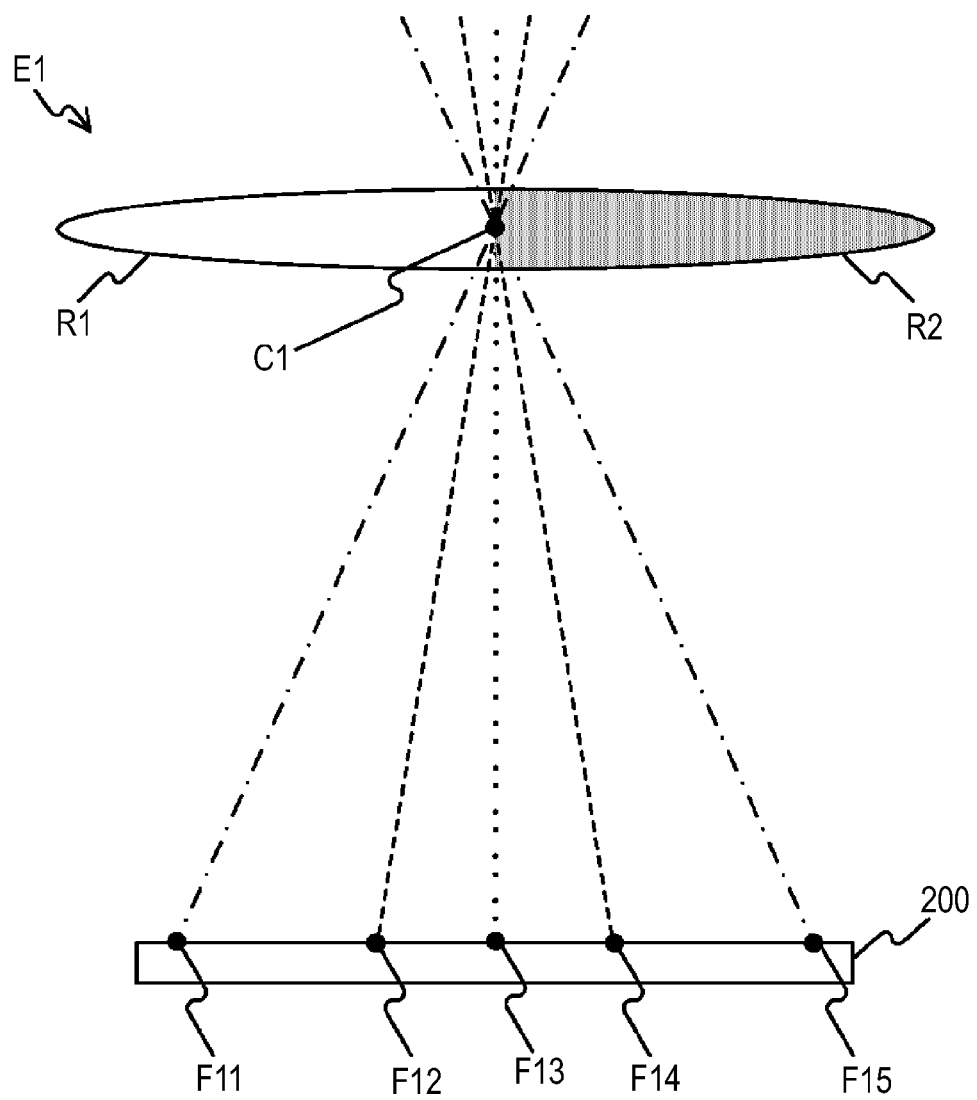
FIG. 14 is a schematic diagram showing the relationship between the image height and the pupil-splitting in the second image sensor of the first embodiment of the present disclosure.

FIG. 14 is a schematic diagram showing the relationship between the image height and the pupil-splitting in the second image sensor 200 of the first embodiment of the present disclosure.

FIG. 14 shows the exiting pupil E1 and the second image sensor 200. Moreover, in the image sensor 200, predetermined positions (positions F11 to F15) in the second image sensor 200 are depicted. Moreover, from the respective positions, lines (lines passing through the center C1) representing the boundaries of regions split by the phase-difference detection pixels at the positions F11 to F14 are drawn. Furthermore, in the exiting pupil E1, the left half region (region R1) of the exiting pupil E1 and the right half region (region R2) of the exiting pupil E1 are depicted.

In all phase-difference detection pixels of the second image sensor 200, the principal ray image point is approximately identical to the position near the end of the light blocking layer closer to the light receiving element. Therefore, as shown in FIG. 14, all phase-difference detection pixels can perform the pupil-splitting of splitting the exiting pupil evenly into two parts.

As described above, in the first embodiment of the present disclosure, since all phase-difference detection pixels perform the pupil-splitting of splitting the exiting pupil evenly into two parts, it is possible to reduce the unevenness of the phase-difference characteristics of the phase-difference detection pixels in the imaging device and to homogenize the phase-difference characteristics.

<2. Second Embodiment>

In the first embodiment of the present disclosure, an example in which the distance between the microlens and the light blocking layer is changed with the image height by adjusting the thickness of the transparent layer (the distance adjustment layer 380) has been described. However, the present disclosure is not limited to this, and the distance (M-S distance) between the microlens and the light blocking layer may be changed with the image height so that the principal ray image point is approximately identical to the position near the end of the light blocking layer closer to the light receiving element.

Therefore, in the second embodiment of the present disclosure, an example in which a distance adjustment layer of which the thickness changes with the image height is formed in a stage before forming the light receiving element will be described with reference to FIG. 14.

[Example of Position of Light Blocking Layer in Phase-Difference Detection Pixel]

Figure 15:
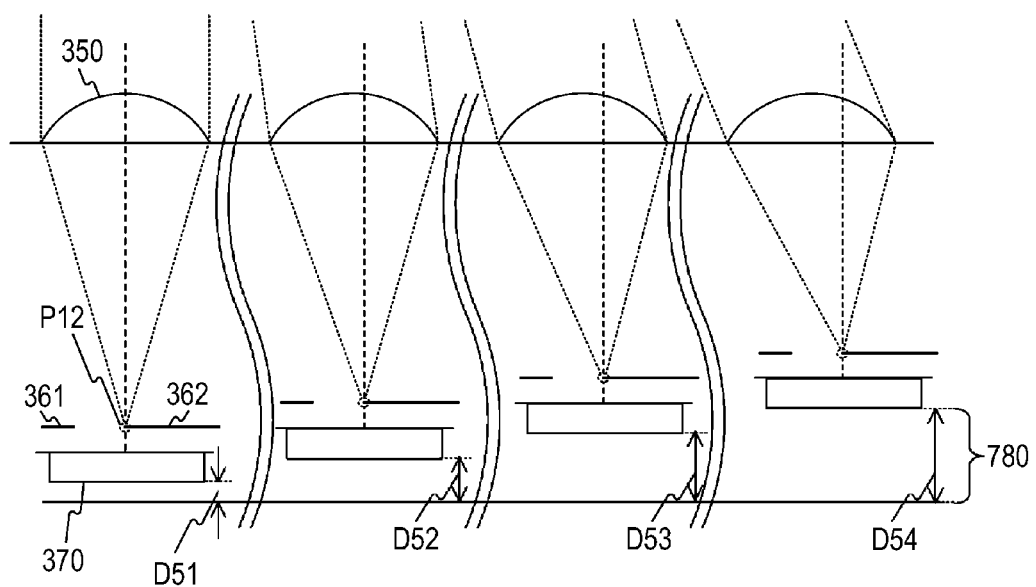
FIG. 15 is a schematic diagram showing an example of a distance adjustment layer in a second embodiment of the present disclosure.

FIG. 15 is a schematic diagram showing an example of a distance adjustment layer in the second embodiment of the present disclosure.

FIG. 15 shows phase-difference detection pixels 310 at four positions of the second image sensor in the second embodiment of the present disclosure and the image points of principal rays of light focused by microlenses 350 provided in the phase-difference detection pixels 310. The phase-difference detection pixels 310 shown in FIG. 15 correspond to the phase-difference detection pixels 310 shown in FIG. 11B.

In FIG. 15, in place of the distance adjustment layer 380 shown in FIG. 11B, a distance adjustment layer 780 that adjusts the position in the Z-axis direction (up and down direction) of the light receiving element 370 in the second image sensor 200 is shown.

As shown in FIG. 15, by providing the distance adjustment layer 780, the heights of the light receiving element and the light blocking layer are changed with the image height. Moreover, in the second embodiment of the present disclosure, the distance between the light receiving element and the light blocking layer is approximately constant for each pixel regardless of the image height. Furthermore, in the second embodiment of the present disclosure, the microlenses 350 of the respective pixels are disposed on the same plane. Therefore, in the second embodiment of the present disclosure, similarly to the first embodiment of the present disclosure, the distance between the light blocking layer and the microlens in the optical axis direction of the microlens decreases as the image height increases. That is, according to the second embodiment of the present disclosure, similarly to the first embodiment of the present disclosure, it is possible to homogenize the phase-difference characteristics of the phase-difference detection pixels in the imaging device. Moreover, according to the second embodiment of the present disclosure, since the distance between the microlens 350 and the light receiving element 370 decreases as compared to the first embodiment of the present disclosure, it is possible to reduce a loss of focused light.

<3. Third Embodiment>

In the first and second embodiments of the present disclosure, an example in which the position of the light blocking layer in the second image sensor 200 shifts toward the microlens with the image height has been described. However, the distance (M-S distance) between the microlens and the light blocking layer can be also changed with the image height by adjusting the position of the microlens in the second image sensor 200.

Therefore, in the third embodiment of the present disclosure, an example in which a distance adjustment layer is manufactured so that the height of the microlens with respect to the light receiving element decreases with the image height will be described with reference to FIGS. 16 and 17.

[Example of Relationship Between Light Receiving Element and Microlens in Phase-Difference Detection Pixel]

Figure 16:
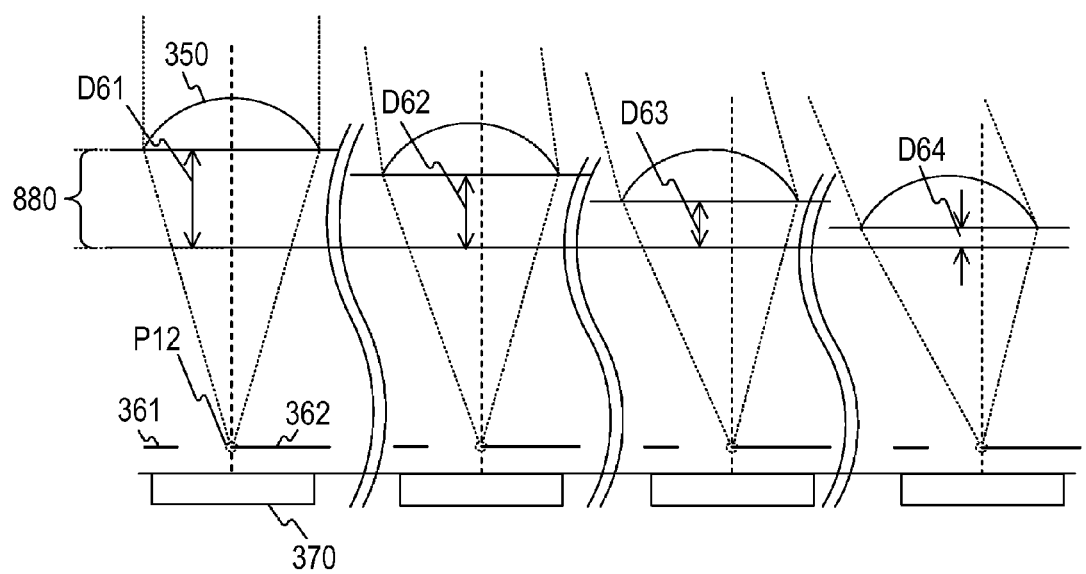
FIG. 16 is a schematic diagram showing an example of the relationship of the distance between a light receiving element and a microlens in a phase-difference detection pixel of a third embodiment of the present disclosure.

FIG. 16 is a schematic diagram showing an example of the relationship of the distance between a light receiving element and a microlens in a phase-difference detection pixel of the third embodiment of the present disclosure.

FIG. 16 shows phase-difference detection pixels 310 at four positions of a second image sensor 800 according to the third embodiment of the present disclosure and the image points of principal rays of light focused by the microlens 350 provided in the phase-difference detection pixels 310. The phase-difference detection pixels 310 shown in FIG. 16 correspond to the phase-difference detection pixels 310 shown in FIGS. 11B and 15.

In FIG. 16, in place of the distance adjustment layer 380 shown in FIG. 11B, a distance adjustment layer 880 that adjusts the positions in the Z-axis direction (up and down direction) of the microlenses of the respective pixels in the second image sensor 800 is shown. The distance adjustment layer 880 adjusts the position of the image point by adding the thickness of the layer between the microlens and the light blocking layer. Therefore, the distance adjustment layer 880 is manufactured so that the thickness of the transparent layer (the distance adjustment layer 880) increases gradually from the periphery of the second image sensor 800 toward the center thereof inversely from the distance adjustment layers 380 and 780.

That is, as shown in FIG. 16, by providing the distance adjustment layer 880, the height of the microlens is changed with the image height. On the other hand, in the third embodiment of the present disclosure, the light receiving elements 370 of the respective pixels are disposed on the same plane. Moreover, in the third embodiment of the present disclosure, the distance between the light receiving element and the light blocking layer is approximately constant for each pixel regardless of the image height. Therefore, in the third embodiment of the present disclosure, similarly to the first embodiment of the present disclosure, the distance between the light blocking layer and the microlens decreases as the image height increases.

[Example of Relationship Between Microlens and Light Blocking Layer in Second Image Sensor]

Figure 17A:
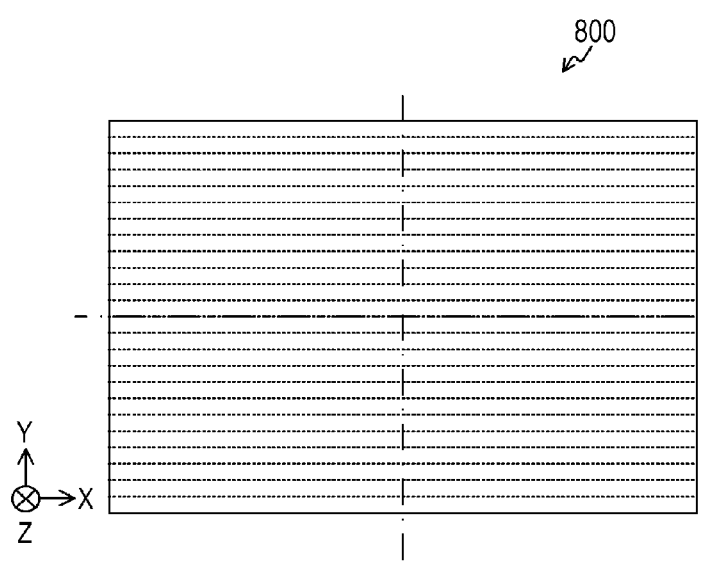
FIGS. 17A to 17C are schematic diagrams showing the relationship between the distance between a microlens and a light blocking layer and the image height in the second image sensor of the third embodiment of the present disclosure.
Figure 17C:
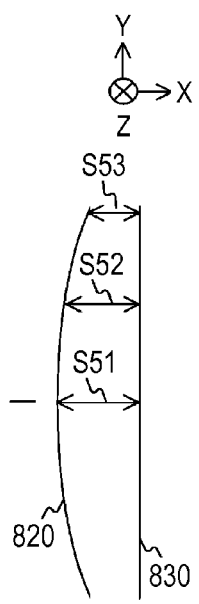
Figure 17B:
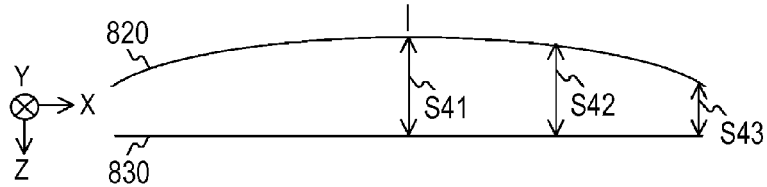

FIGS. 17A to 17C are schematic diagrams showing the relationship between the distance between a microlens and a light blocking layer and the image height in the second image sensor 800 of the third embodiment of the present disclosure. FIGS. 17A to 17C correspond to FIGS. 10A to 10C. In FIGS. 17A to 17C, in place of the microlens position 359 and the light blocking layer position 369 in FIGS. 10A to 10C, a microlens position 820 and a light blocking layer position 830 are shown.

The difference between FIGS. 17A to 17C and FIGS. 10A to 10C will be described. In FIGS. 17A to 17C, in the third embodiment of the present disclosure, the distance adjustment layer 880 adjusts the distance (M-S distance) between the microlens and the light blocking layer, of the microlens itself. That is, the light receiving element and the light blocking layer are formed on a flat layer. Therefore, the positions in the Z-axis direction of the light blocking layers 361 and 362 are approximately constant regardless of the image height as shown in the light blocking layer position 830.

On the other hand, the positions of the microlenses 350 approach the light blocking layer position 830 as they approach the end of the second image sensor 800 from the center as shown in the microlens position 820. Therefore, the M-S distance relation in the X-axis direction satisfies S41>S42>S43 as shown in FIG. 17B. Similarly, the M-S distance relation in the Y-axis direction satisfies S51>S52>S53 as shown in FIG. 17C.

As described above, in the third embodiment of the present disclosure, by making the positions in the Z-axis direction of the light blocking layers of the respective pixels even to thereby adjust the position of the microlens, it is possible to homogenize the phase-difference characteristics of the imaging device similarly to the first embodiment of the present disclosure.

As described above, according to the embodiments of the present disclosure, it is possible to homogenize the phase-difference characteristics of the imaging device.

In addition, although the embodiments of the present disclosure have been described as an example of the second image sensor which includes both the phase-difference detection pixel and the image generation pixel, the present disclosure is not limited to this. For example, the present disclosure can be similarly applied to an image sensor having only the phase-difference detection pixel.

Moreover, although the embodiments of the present disclosure have been described as an example of the second image sensor 200 in which the line of image generation pixels and the line of phase-difference detection pixels alternate each other, the present disclosure is not limited to this. For example, the present disclosure can be similarly applied to an image sensor in which phase-difference detection pixels are scattered about. Furthermore, although the embodiments of the present disclosure have been described as an example of the image sensor 200 in which only the phase-difference detection pixels are pupil-split in the X-axis direction of the second image sensor 200, the present disclosure is not limited to this. Various arrangement examples can be considered for the phase-difference detection pixels. For example, a arrangement example in which phase-difference detection pixels pupil-split in the X-axis direction and phase-difference detection pixels pupil-split in the Y-axis direction coexist can be also considered.

In addition, although the embodiments of the present disclosure have been described as an example of a single-lens reflex camera, the embodiments of the present disclosure can be applied to other apparatuses having the imaging device in which the phase-difference detection pixels are disposed. For example, the present disclosure can be also applied to other digital cameras other than the single-lens reflex camera, such as a digital still single-lens reflex camera or a compact digital camera.

The embodiments of the present disclosure are shown as an example for implementing the present disclosure. As mentioned in the embodiments of the present disclosure, the matters in the embodiments of the present disclosure have corresponding relations to the subject matters in the appended claims. Similarly, the subject matters in the appended claims have corresponding relations to the matters in the embodiments of the present disclosure having the same names as the subject matters. However, the present disclosure is not limited to the embodiments, and various modifications can be made in the range without departing from the gist of the present disclosure.

In addition, the processing procedures described in the embodiments of the present disclosure may be grasped as the methods including the series of procedures. Moreover, the series of procedures may be grasped as the programs for making a computer execute the series of the procedures, or a recording medium storing the programs. As the recording medium, a CD (Compact Disc), a MD (MiniDisc), a DVD (Digital Versatile Disc), a memory card, a Blu-Ray disc (the registered trademark), and the like may be used.

The present disclosure contains subject matter related to that disclosed in Japanese Priority Patent Application JP 2010-183149 filed in the Japan Patent Office on Aug. 18, 2010, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device comprising:
a microlens configured to focus subject light;
a light receiving element configured to receive the focused subject light to generate a signal for determining focus through phase-difference detection; and
a light blocking portion disposed between the microlens and the light receiving element and configured to block a portion of the focused subject light,
wherein the light blocking portion is disposed such that a distance between the light blocking portion and the microlens in an optical axis direction of the microlens decreases as an image height increases.

2. The imaging device according to claim 1, wherein the distance between the microlens and the light receiving element is approximately the same in each pixel, and wherein the light blocking portion is disposed such that the distance between the light blocking portion and the light receiving element in the optical axis direction increases as the image height increases.

3. The imaging device according to claim 1, wherein the distance between the microlens and the light receiving element decreases as the image height increases, and wherein the light blocking portion is disposed so that the distance between the light blocking portion and the light receiving element in the optical axis direction is approximately the same in each pixel.

4. The imaging device according to claim 3, wherein the microlens is disposed in each pixel on the same plane that is orthogonal to the optical axis direction.

5. The imaging device according to claim 3, wherein the light receiving element is disposed in each pixel on the same plane that is orthogonal to the optical axis direction.

6. The imaging device according to claim 1, wherein the light blocking portion is disposed such that an image point of the focused subject light corresponds to a position of the light blocking portion in the optical axis direction.

7. The imaging device according to claim 6, wherein the microlens is disposed such that an image point of a principal ray of the focused subject light corresponds to an end of the light blocking portion close to the center of the light receiving element in a direction orthogonal to the optical axis direction.

8. The imaging device according to claim 1, wherein the phase-difference detection is performed using a plurality of phase-difference detection pixels and image signals are generated using a plurality of image generation pixels, the plurality of phase-difference detection pixels and the plurality of image generation pixels coexisting in the imaging device, wherein the plurality of phase-difference detection pixels are formed by the microlens, the light receiving element, and the light blocking portion, and wherein the plurality of image generation pixels comprise another light receiving element and another microlens having the same characteristics as the light receiving element and the microlens.

9. The imaging device according to claim 8, wherein the plurality of the phase-difference detection pixels and the plurality of the image generation pixels alternate each other in the imaging device in a direction orthogonal to a readout direction in which data generated by the plurality of the phase-difference detection pixels and the plurality of the image generation pixels are read out from the plurality of the phase-difference detection pixels and the plurality of the image generation pixels.

10. An imaging apparatus comprising:
an imaging device comprising:
a microlens configured to focus subject light;
a light receiving element configured to receive the focused subject light to generate a signal for focus detection through phase-difference detection; and
a light blocking portion disposed between the microlens and the light receiving element and configured to block a portion of the focused subject light, wherein the light blocking portion is disposed such that a distance between the light blocking portion and the microlens in an optical axis direction of the microlens decreases as an image height increases; and
a focus determination section configured to perform the focus detection based on the signal generated by the imaging device.

11. The imaging device according to claim 1, wherein a transparent layer is disposed between the light blocking portion and the light receiving element, wherein a thickness of the transparent layer increases with increase in the image height.

12. The imaging device according to claim 11, wherein the distance between the light blocking portion and the microlens is changed by adjusting the thickness of the transparent layer.

13. The imaging apparatus according to claim 10, wherein a transparent layer is disposed between the light blocking portion and the light receiving element such that distance of the microlens with respect to the light receiving element decreases with the image height.

14. The imaging apparatus according to claim 10, wherein an amount of shift of an image point of a principal ray of the focused subject light toward the microlens increases as the image height increases.

* * * * *